United States Patent
Dai et al.

(10) Patent No.: US 9,568,646 B2
(45) Date of Patent: *Feb. 14, 2017

(54) METHODS FOR REDUCING DIFFUSE REFLECTION OF NANOSTRUCTURE-BASED TRANSPARENT CONDUCTIVE FILMS AND TOUCH PANELS MADE OF THE SAME

(71) Applicant: CAM Holding Corporation, Tortola OT OT (VG)

(72) Inventors: Haixia Dai, San Jose, CA (US); Michael A. Spaid, Mountain View, CA (US); Jeffrey Wolk, Half Moon Bay, CA (US); Kalpesh Biyani, Fremont, CA (US)

(73) Assignee: CAM Holding Corporation, Tortola (VG)

( * ) Notice: Subject to any disclaimer, the term of this patent is extended or adjusted under 35 U.S.C. 154(b) by 636 days.

This patent is subject to a terminal disclaimer.

(21) Appl. No.: 13/801,322

(22) Filed: Mar. 13, 2013

(65) Prior Publication Data

US 2013/0194671 A1    Aug. 1, 2013

Related U.S. Application Data

(63) Continuation-in-part of application No. 13/668,006, filed on Nov. 2, 2012.

(Continued)

(51) Int. Cl.
| | |
|---|---|
| *G02B 5/02* | (2006.01) |
| *G02B 1/10* | (2015.01) |
| *G02B 1/11* | (2015.01) |
| *B82Y 20/00* | (2011.01) |
| *G06F 3/041* | (2006.01) |

(Continued)

(52) U.S. Cl.
CPC .................. *G02B 1/11* (2013.01); *B82Y 20/00* (2013.01); *G02B 1/113* (2013.01); *G02B 5/0215* (2013.01); *G02B 5/0294* (2013.01); *G06F 3/045* (2013.01); *G06F 3/0412* (2013.01); *H01B 1/16* (2013.01);

(Continued)

(58) Field of Classification Search
CPC ............. G02B 1/00; G02B 1/10; G02B 1/105; G02B 1/11; G02B 1/111; G02B 1/113; G02B 1/115; G02B 1/116; G02B 5/00; G02B 5/02; G02B 5/0284; G02B 5/0294; G06F 3/0412; G06F 3/045
See application file for complete search history.

(56) References Cited

U.S. PATENT DOCUMENTS 6,064,524 A * 5/2000 Oka ........................ G02B 1/11
359/580
6,335,832 B1 * 1/2002 Oka ........................ B29C 70/60
359/580

(Continued)

FOREIGN PATENT DOCUMENTS

WO     2004/067638    * 8/2004

OTHER PUBLICATIONS

Sun et al., "Crystalline Silver Nanowires by Soft Solution Processing," Nano Letters 2(2): 165-168, 2002.

*Primary Examiner* — Thong Nguyen
(74) *Attorney, Agent, or Firm* — Cooper Legal Group, LLC

(57) ABSTRACT

The present disclosure relates to optical stacks having nanostructure-based transparent conductive films and low diffuse reflection. Also described are display devices that incorporate the optical stacks.

20 Claims, 33 Drawing Sheets

Related U.S. Application Data

(60) Provisional application No. 61/556,114, filed on Nov. 4, 2011, provisional application No. 61/598,239, filed on Feb. 13, 2012.

(51) Int. Cl.
  *G06F 3/045* (2006.01)
  *H01B 1/16* (2006.01)
  *G02B 1/113* (2015.01)
  *H01L 33/42* (2010.01)

(52) U.S. Cl.
  CPC ..... *G06F 2203/04103* (2013.01); *H01L 33/42* (2013.01)

(56) References Cited

U.S. PATENT DOCUMENTS

| | | | |
|---|---|---|---|
| 7,695,781 B2 * | 4/2010 | Yoneyama | G02B 1/111 349/137 |
| 7,901,746 B2 * | 3/2011 | Noguchi | B32B 27/00 349/12 |
| 8,049,333 B2 | 11/2011 | Alden et al. | |
| 2005/0221054 A1 * | 10/2005 | Kawano | G02B 1/105 428/143 |
| 2007/0074316 A1 | 3/2007 | Alden et al. | |
| 2008/0210052 A1 | 9/2008 | Allemand | |
| 2009/0015927 A1 * | 1/2009 | Matsumura | G02B 1/105 359/614 |
| 2009/0191389 A1 | 7/2009 | Guiheen et al. | |
| 2009/0213092 A1 | 8/2009 | Kuo et al. | |
| 2009/0239082 A1 * | 9/2009 | Fujita | H05K 3/323 428/413 |
| 2010/0243295 A1 | 9/2010 | Allemand et al. | |
| 2011/0088770 A1 | 4/2011 | Allemand et al. | |
| 2011/0174190 A1 | 7/2011 | Sepa et al. | |
| 2011/0216020 A1 | 9/2011 | Lee et al. | |
| 2012/0008206 A1 * | 1/2012 | Haga | G02B 5/0221 359/488.01 |
| 2012/0176681 A1 * | 7/2012 | Chang | C23C 18/1225 359/614 |

* cited by examiner

METHODS FOR REDUCING DIFFUSE REFLECTION OF NANOSTRUCTURE-BASED TRANSPARENT CONDUCTIVE FILMS AND TOUCH PANELS MADE OF THE SAME

BACKGROUND

Transparent conductive films comprise electrically conductive material coated on high-transmittance surfaces or substrates, and are widely used in flat panel displays such as liquid crystal displays (LCD), touch panels or sensors, electroluminescent devices (e.g., light emitting diodes), thin film photovoltaic cells, or as anti-static layers and electromagnetic wave shielding layers.

Currently, vacuum deposited metal oxides, such as indium tin oxide (ITO), are the industry standard materials for providing optical transparency and electrical conductivity to dielectric surfaces such as glass and polymeric films. However, metal oxide films are fragile and prone to damage during bending or other physical stresses. They also require elevated deposition temperatures and/or high annealing temperatures to achieve high conductivity levels. For certain substrates that are prone to adsorbing moisture, such as plastic and organic substrates (e.g., polycarbonates), it becomes problematic for a metal oxide film to adhere properly. Applications of metal oxide films on flexible substrates are therefore severely limited. In addition, vacuum deposition is a costly process and requires specialized equipment. Moreover, the process of vacuum deposition is not conducive to forming patterns and circuits. This typically results in the need for expensive patterning processes such as photolithography.

In recent years there is a trend to replace current industry standard transparent conductive ITO films in flat panel displays with a composite material of metal nanostructures (e.g., silver nanowires) embedded in an insulating matrix. Typically, a transparent conductive film is formed by first coating on a substrate an ink composition including silver nanowires and a binder. The binder provides the insulating matrix. Thereafter, a transparent UV or thermally curable polymer materials can be coated to form a protection layer. Nanostructure-based coating technologies are particularly suited for printed electronics. Using a solution-based format, printed electronic technology makes it possible to produce robust electronics on large-area, flexible substrates.

The presence of particulate nanostructures in transparent conductive films may give rise to certain optical challenges that are not typically encountered in the ITO films, which are continuous. FIG. 1 shows an ITO touch sensor (10) and a nanowire-based touch sensor (12) in a side-by-side view, both placed on top an LCD module (14). When the LCD module (14) is turned off, the ITO touch sensor (10) appears black in the ambient light; whereas the touch sensor made from silver nanowire-based transparent films (12) has a "milkier" or "cloudier" look. Thus, there is a need to address the optical challenges unique to nanostructure-based transparent conductors.

BRIEF SUMMARY

Provided herein are various embodiments directed to reducing or minimizing diffuse reflection in optical stacks that include at least one nanostructure-based conductive film.

One embodiment provides an optical stack comprising:
at least one nanostructure layer;
an overcoat layer immediately overlying the nanostructure layer; and
at least one substrate adjacent to the nanostructure layer, wherein the nanostructure layer includes a plurality of conductive nanostructures, and wherein a diffuse reflection of an incident light, as viewed from the same side of the optical stack as the incident light, is less than 6% of the incident light, and wherein the nanostructure layer is more proximate to the incident light than the substrate.

In a further embodiment, the optical stack further comprises an insulating medium embedding the plurality of conductive nanostructures.

In another embodiment, the insulating medium has a refractive index of less than 1.5, or the insulating medium is air.

In yet another embodiment, the individual nanostructures do not have an organic coating or have a low-index organic coating.

In a further embodiment, the insulating medium is HPMC, and the plurality of conductive nanostructures are silver nanowires, and wherein a weight ratio of HPMC and the plurality of conductive nanostructures is about 1:1, and the nanostructure layer has a sheet resistance of less than 100 ohms/sq.

In a further embodiment, the overcoat has a refractive index of less than 1.55.

In a further embodiment, the overcoat is a low-index optically clear adhesive (OCA) layer having a refractive index of 1.45 or less.

In a further embodiment, the overcoat comprises a plurality of porous nanoparticles and a low-index binder.

In a further embodiment, the porous nanoparticles are silica nanoparticles having an internal void volume of 50-90%.

In a further embodiment, the porous nanoparticles are present at 20-80% by volume of the overcoat.

In a further embodiment, the binder is a UV-curable resin having a refractive index of less than 1.5.

In a further embodiment, the binder is an acrylic or polyurethane resin.

In a further embodiment, the overcoat has a refractive index of 1.22.

In a further embodiment, the optical stack further comprises an undercoat interposed between the substrate and the nanostructure layer, the undercoat immediate underlying the nanostructure layer, wherein the undercoat has a higher refractive index than that of the insulating medium and that of the substrate.

In a further embodiment, the undercoat has a refractive index of at least 1.65.

In a further embodiment, the undercoat comprises $TiO_2$, polyimide, $SiO_2$, or $ZnO_2$.

In a further embodiment, the optical stack further comprises an outermost cover layer that is the most proximate to the incident light and has a refractive index of at least 1.7.

In a further embodiment, the outermost cover layer is a $TiO_2$ layer.

In a further embodiment, the optical stack comprises a conductive region and a non-conductive region in the nanostructure layer, the conductive region having first sheet resistance, and the non-conductive region having second sheet resistance, wherein the first sheet resistance is at least $10^3$ more than the second sheet resistance.

BRIEF DESCRIPTION OF THE SEVERAL VIEWS OF THE DRAWINGS

In the drawings, identical reference numbers identify similar elements or acts. The sizes and relative positions of elements in the drawings are not necessarily drawn to scale. For example, the shapes of various elements and angles are not drawn to scale, and some of these elements are arbitrarily enlarged and positioned to improve drawing legibility. Further, the particular shapes of the elements as drawn are not intended to convey any information regarding the actual shape of the particular elements, and have been selected solely for ease of recognition in the drawings.

DETAILED DESCRIPTION

Described herein include the underlying cause for the "milky" appearance, methods for addressing the same, and optical stacks that have lower or no milky appearance. As used herein, "optical stack" refers to a multi-layer stack of clear thin films through which light from either an external or an internal source travels, one or more layers having an impact on the optical behavior of the light. The thin films within the optical stack are typically functional films such as transparent conductive films, polarizers, color filters, anti-glare films, or anti-reflective films, as well as protective coatings and clear adhesives. The thin films can be flexible (e.g., polymer substrate) or rigid (e.g., glass substrate). The optical stack is typically coupled to another functional unit such as a display. In addition to the films, air space between films or between the films and the display also contribute to the optical behavior of the light, and is considered a part of the optical stack.

Figure 1:
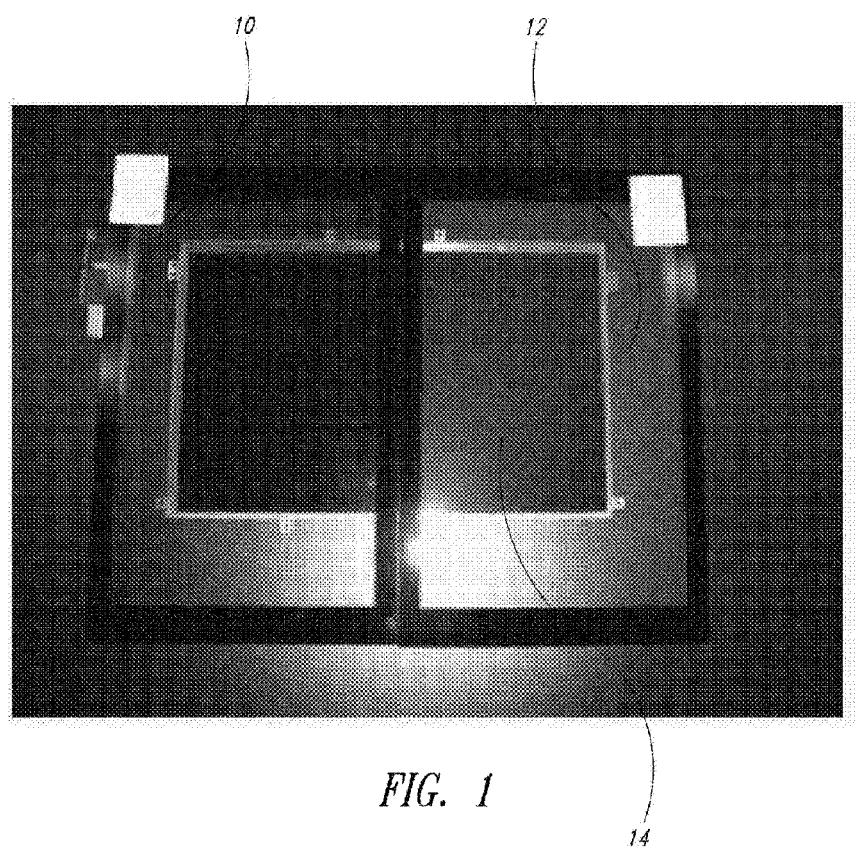
FIG. 1 shows a side-by-side view of an ITO-based touch sensor and a nanostructure-based touch sensor on an LCD module.
Figure 2A:
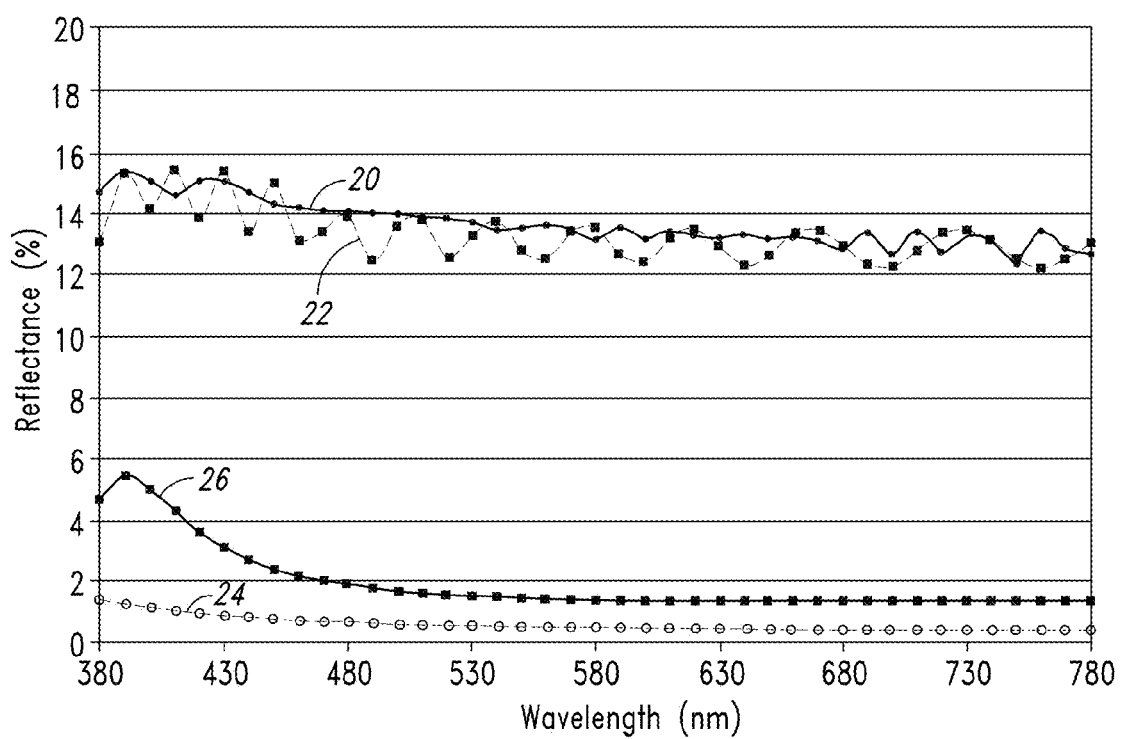
FIG. 2A shows the total reflections and diffuse reflections of the ITO touch sensor and the nanostructure-based touch sensor, respectively.

The applicants have identified that diffuse reflection, as opposed to total reflection, directly correlates to the intensity of the "milkiness." FIG. 2A shows the total reflections and diffuse reflections of the ITO touch sensor (10) and the nanowire-based touch sensor (12), respectively. As shown, although the total reflection (20) for the ITO sensor and the total reflection (22) of the nanowire-based touch sensor are comparable, their diffuse reflections differ significantly. In the visible range (380-780 nm), the diffuse reflection of the ITO touch sensor (24) is substantially constant and generally less than 1%. The diffuse reflection (26) of the nanowire-based touch sensor has a peak value of nearly 6% in the shorter wavelength portion of the visible range (less than 450 nm) and gradually reduced to less than 2% as the wavelength increases. Thus, the "milky" appearance of an optical stack that includes nanostructure-based conductive film is attributed to diffuse reflection of the ambient light.

Figure 2B:
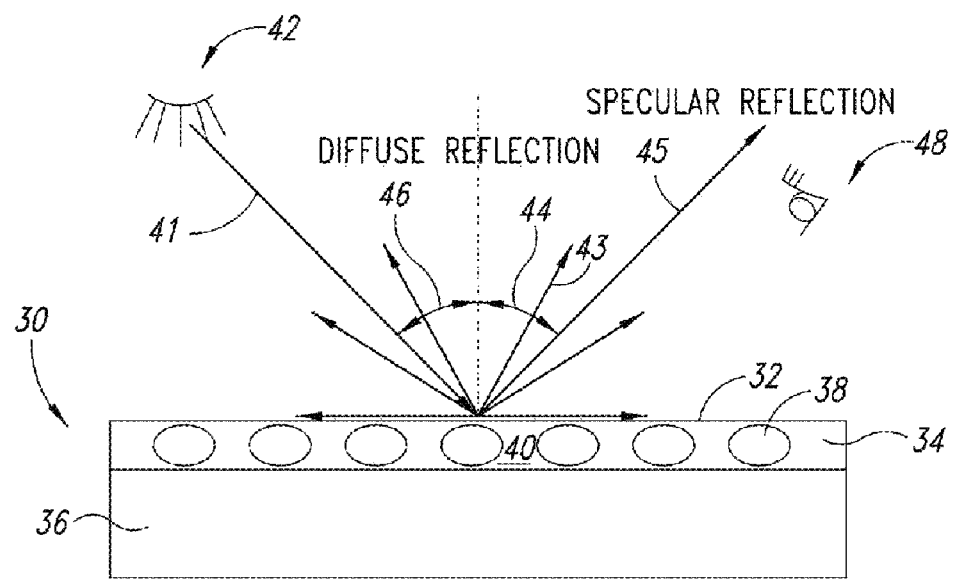
FIGS. 2B and 2C show schematically specular and diffuse light reflections in two different conductive film orientations.

FIG. 2B shows a basic optical stack (30) having a surface (32) and a transparent conductive film (34) coated on a substrate (36). The conducive layer (34) comprises a nanostructure layer having a plurality of conductive nanostructures (38) embedded in a transparent insulating medium or binder (40). As used herein and with reference to FIG. 2B, "diffuse reflection" refers to the reflection of an incident light (41), emitted from an external light source (42), whereby the reflected light (43) does not follow the Law of Reflection. Diffuse reflection is a result of light scattering off a non-smooth surface or, in the case of a transparent conductive film, the particulate nanostructures (38) in the film. Unlike "specular reflection," which reflects off the surface (32) and follows the Law of Reflection in that the angle (44) of the reflected light (45) is the same as the angle (46) of the incident light (41), diffuse reflections (43) travel in many different angles as compared to the incident angle (46).

Unless specified otherwise, "diffuse reflection" refers to backwards diffuse reflection, which is the scattered light observable by a viewer (48) on the same side of the optical stack as the incident light. "Backwards diffuse reflection" is to be distinguished from "forward diffuse reflection," which refers to the scattered light that transmits through the optical stack, i.e., traveling in the same direction as the incident light.

Figure 2C:
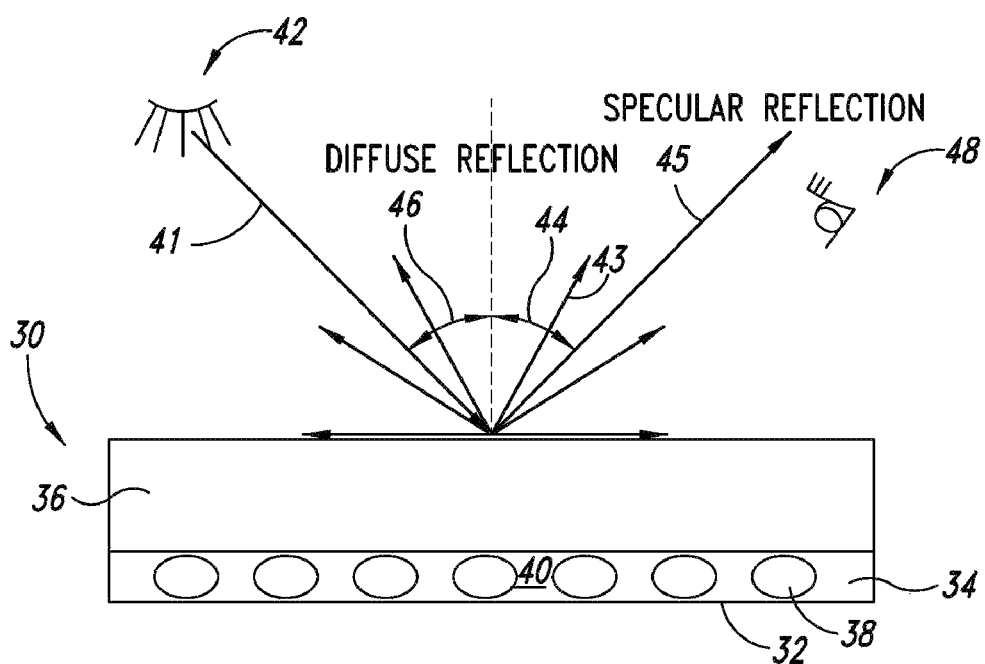

It should also be noted that, given the same basic optical stack or conductive film (30), depending on the orientations of the stack, the diffusion reflections may be different. For example, in Figure, the optical stack (30) is oriented in such a way that the incident light (41) travels from the nanostructure layer into the substrate (36), and the diffusion reflection is observed by the viewer (48). If, on the other hand, the optical stack (30) is oriented in such a way that the incident light travels from the substrate side (36) into the nanostructure layer as shown in FIG. 2C, the diffuse reflection observed from the substrate side may be different from, the diffuse reflection observed in FIG. 2B. Thus, although most of the embodiments illustrated herein assume that the orientation of the conductive film is such that the external light travels from the nanostructure layer into the substrate, as discussed in further detail herein, the same optical principle applies when the orientation of the optical stack is reversed, i.e., when the light travels from the substrate into the nanostructure layer.

Also in the context of film orientations, a film that "overlies" or is "above" another film is configured to be more proximate to the external light source (or the viewer) than the other film. For instance, an overcoat that overlies the nanostructure layer is always disposed between the external light source (or the viewer) and the nanostructure layer. A film that "underlies" another film is configured to be less proximate to the external light (or the viewer) than the other film. For instance, in an optical stack that employs an undercoat that underlies the nanostructure layer, the nanostructure layer is always disposed between the external light source (or the viewer) and the undercoat.

In the basic optical stack (30), as in more complex ones (e.g., in an entire touch panel sensor), many or all of the layers or structural elements may contribute to the diffuse reflection to certain degrees. Various embodiments described here are approaches to lessen the diffusion reflection through manipulations and modification of individual layers or structural elements. However, it should be understood that any one or more individual embodiments may be combined to provide additive benefit in further reducing diffuse reflection. Thus, various embodiments are directed to optical stacks that comprises at least one nanostructure layer; and at least one substrate adjacent to the nanostructure layer, wherein the nanostructure layer includes a plurality of conductive nanostructures, and wherein a diffuse reflection of an incident light, as viewed from the same side of the optical stack as the incident light, is less than 6%, or less than 5%, or less than 4%, or less than 3%, or less than 2%, or less than 1% of the intensity of the incident light. As used herein, "adjacent" refers to the relative locations of the substrate and the nanostructure layer. They may be in immediate contact, or are near each other with one or more intermediate layers interposed therebetween.

Figure 3:
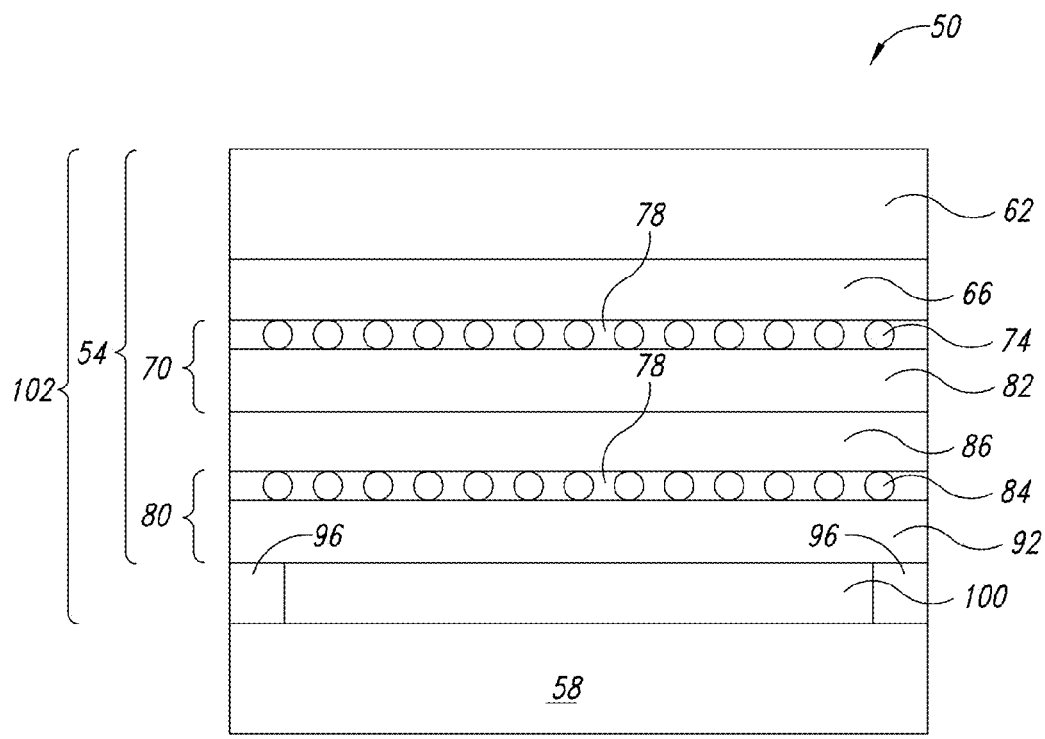
FIG. 3 shows a typical nanostructure-based touch panel display.

FIG. 3 shows a typical nanostructure-based touch panel display (50), which is used as an illustration for exploring the various approaches to reducing diffuse reflection. The touch plane display (50) includes a touch sensor (54) disposed on an LCD module (58). The touch sensor (54) is a multilayer stack that comprises a top glass cover (62), a first optically clear adhesive (OCA) layer (66), a first transparent conductive film (70) which includes a plurality of conductive nanostructures (74) distributed in an insulating medium (78) and coated on a first substrate (82), a second optically clear adhesive layer (86), and a second transparent conductive film (80) which includes a plurality of conductive nanostructures (84) distributed in an insulating medium (78) and coated on a second substrate (92). Two spacers (96) are configured to separate the touch panel and LCD module. In addition to the structural elements described above that form the touch sensor (54), a gap (100) between the touch sensor and the LCD module is a part of an overall optical stack (102) because the gap contributes to the optical behaviors of ambient light as well as any internal light emitting from the LCD module (58) as they travel through the touch panel (50). In a typical construction of a touch panel display (including those of ITO), the gap is filled with air.

Figure 4A:
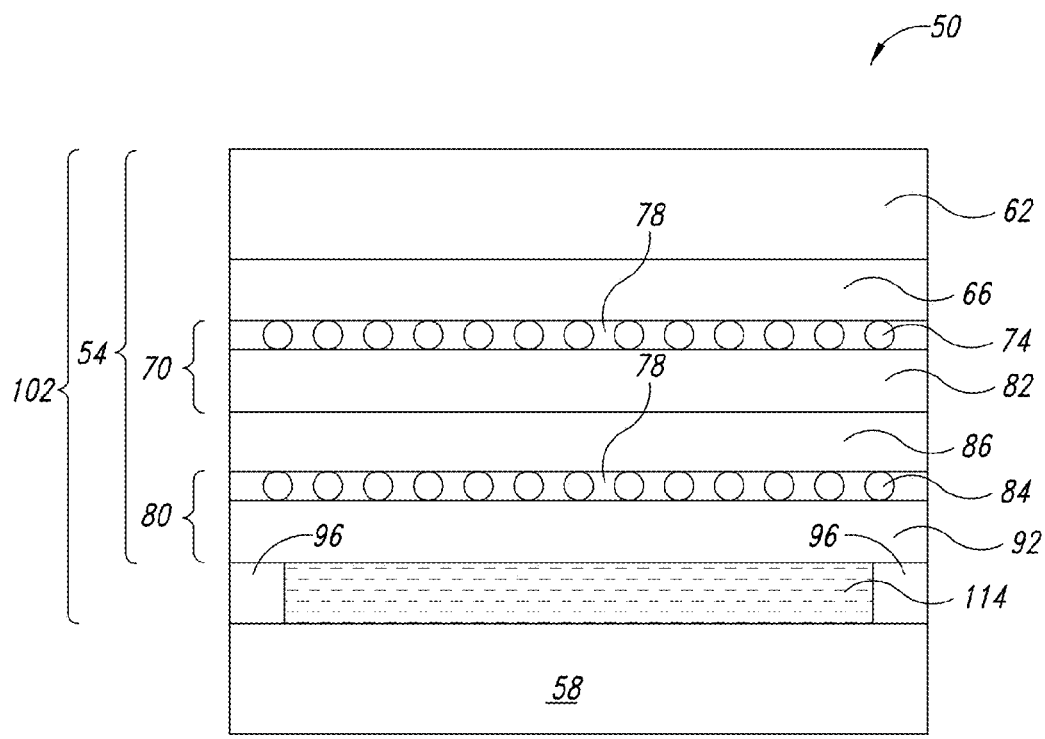
FIG. 4A shows an embodiment in accordance with the present disclosure, in which the gap between a touch sensor and an LCD module is filled with an index fluid.
Figure 4B:
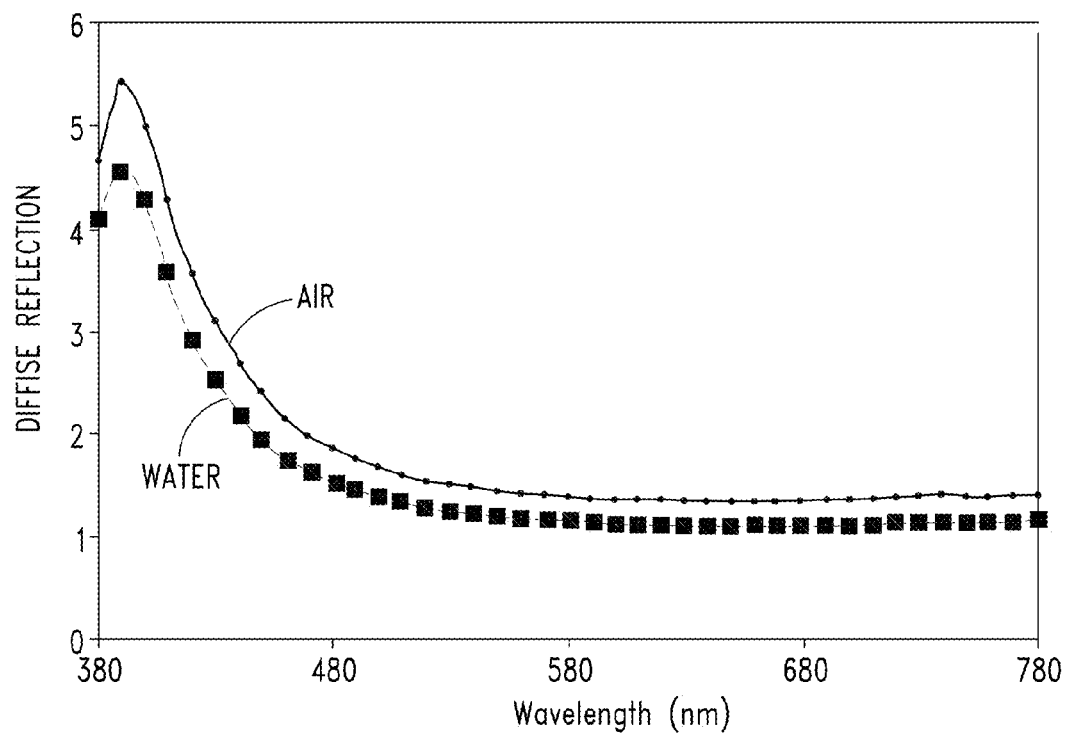
FIG. 4B shows the diffuse reflections of a touch panel display in which the gap between the touch sensor and the LCD module is filled with air as compared to one that is filled with water.

In one embodiment, reduction of the diffuse reflection is observed in an optical stack in which the air gap is filled with a medium having a refractive index higher than that of air. Referring to FIG. 4A, optical stack 50 is otherwise identical to the optical stack of FIG. 3, except that a refractive index fluid 114 is filled in the air space (100) of FIG. 3. Refractive index fluids (or simply "index fluid") are typically clear fluids with various refractive indices ($R_D$). In general, rather than having a single value of the refractive index, the index fluid might have a small range of $R_D$. Index fluids are commercially available in many different values and ranges. In one embodiment, the index fluid is water ($R_D$=1.33) and the diffuse reflection is reduced across the entire visible range (FIG. 4B).

Figure 4C:
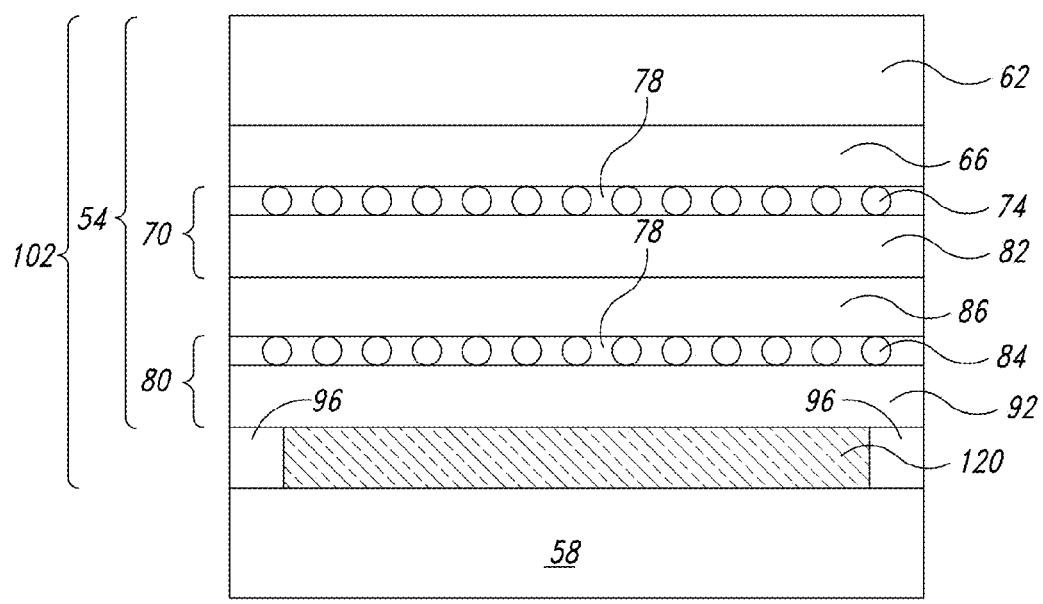
FIG. 4C shows another embodiment in accordance with the present disclosure, in which the gap between a touch sensor and an LCD module is filled with an optically clear bonding or adhesive layer.

The medium that fills the air gap is not limited to a liquid. A clear solid or semisolid (gel) medium may also be used to fill the air gap. FIG. 4C shows an optical stack (118) in which an optically clear bonding or adhesive layer (120) fills in the air gap between the touch screen sensor and the LCD module. The optically clear bonding layer may be, for example, an optically clear adhesive layer (e.g., 3M™ optically clear adhesive).

Figure 4D:
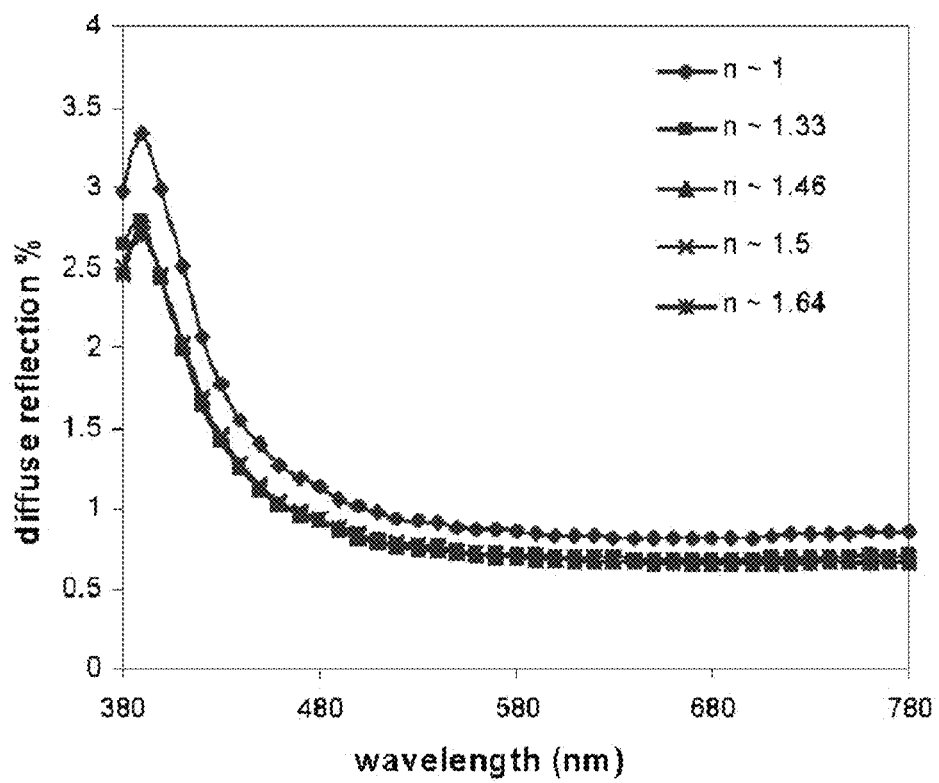
FIG. 4D shows the diffuse reflections of touch panel displays filled with various index fluids in the gap between the touch sensor and the LCD module.

FIG. 4D shows the diffuse reflection of a number of media that fill the gap (100) between the touch sensor and the LCD module in a model touch sensor that includes only one transparent conductive film. As shown, when the air is replaced by another medium that has a higher refractive index ($R_D$>1), the diffuse reflection is reduced. Also shown is that the reduction appears insensitive to the various $R_D$ values, so long as $R_D$ is larger than 1.

Figure 5A:
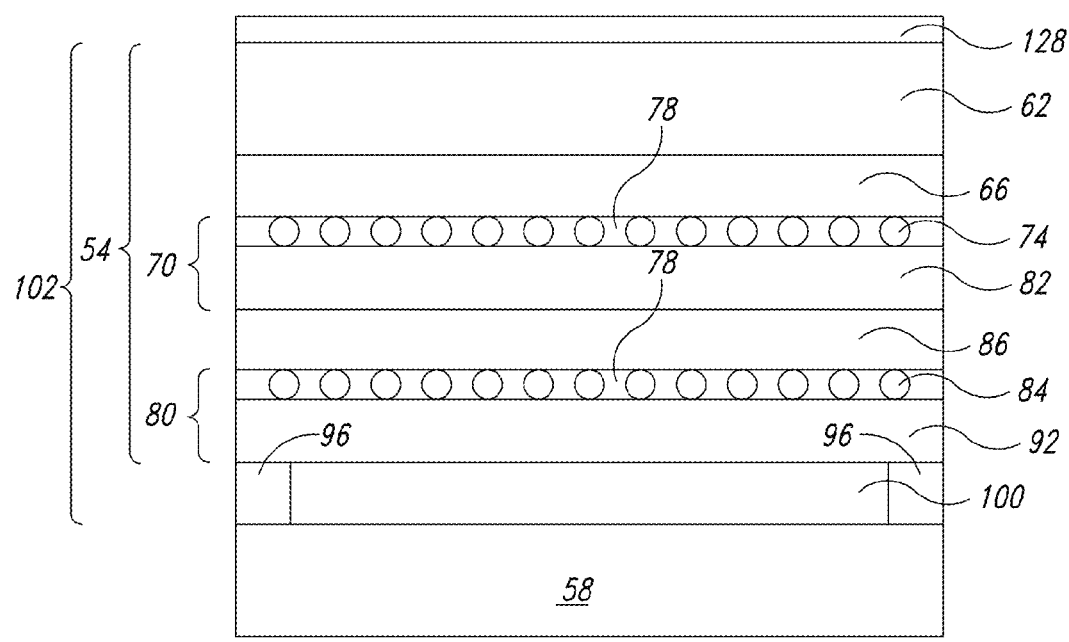
FIG. 5A shows an optical stack according to another embodiment, which includes a high-index outermost cover layer.

In another embodiment and with reference to FIG. 5A, the optical stack (124) further includes an outermost cover layer (128) that overlies the cover glass (62). All other elements are the same as those in FIG. 3. The outermost layer of the optical stack is the layer that is most proximate to the external light and is a high-index layer. Preferably, it has a refractive index higher than that of the cover glass ($R_D$=1.52), and preferably is 1.7 or higher, or preferably is 1.8 or higher. Materials that have higher refractive indices include, for example, $TiO_2$ ($R_D$=1.8), polyimides ($R_D$=1.7), as well as clear polymers embedded with high refractive index particles such as ZnO, $ZrO_2$, and $TiO_2$. As used herein, a "high-index" layer typically has a refractive index of at least 1.65. As used herein, unless specified otherwise, a refractive index is measured at a wavelength within the visible range (380-780 nm), e.g., 589 nm or 630 nm, at room temperature (20-25°). The material may be coated over the cover glass by known methods in the art.

Figure 5B:
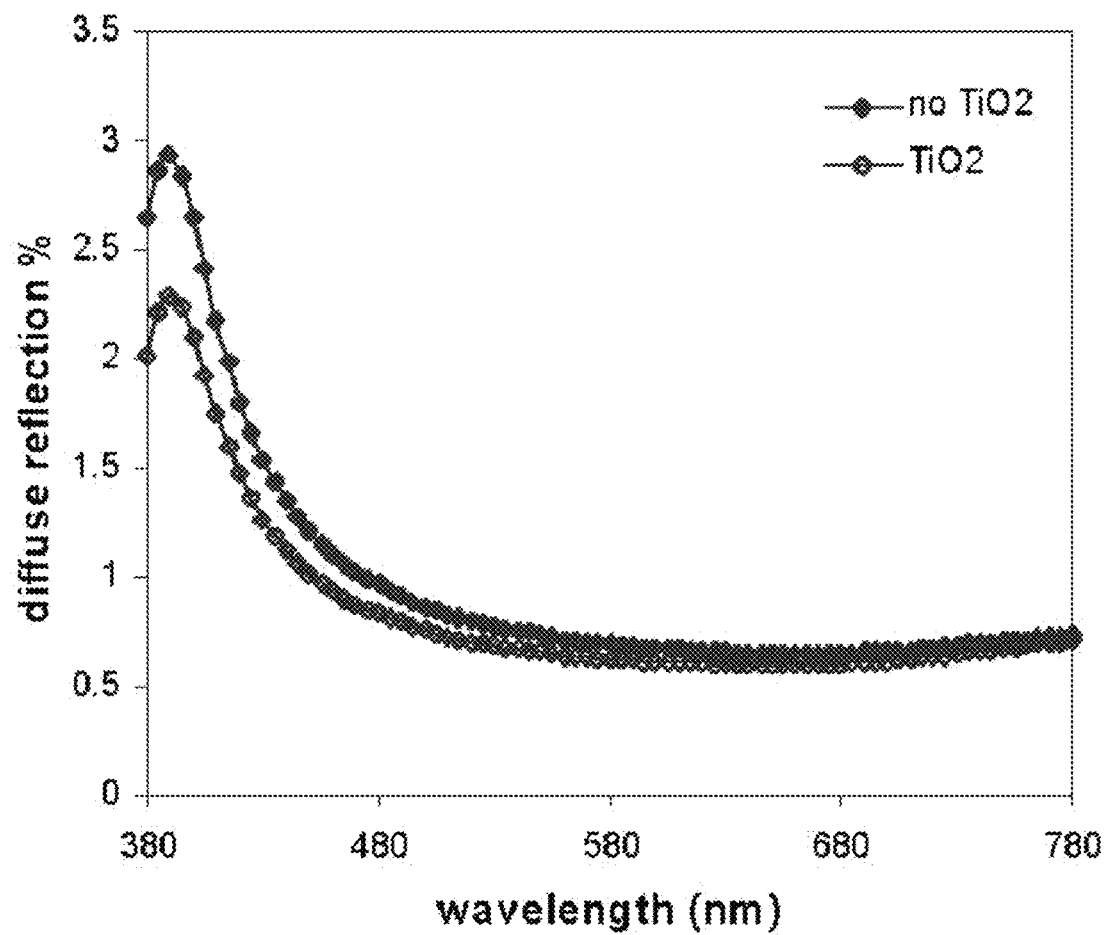
FIG. 5B shows the comparative results of diffuse reflections in optical stacks with and without a high-index outermost cover layer.

FIG. 5B shows the effect on diffuse reflection by coating a high refractive index outermost cover layer such as $TiO_2$ over the cover glass in a model touch sensor that includes only one transparent conductive film. As compared to the optical stack without the $TiO_2$ coating (i.e., the glass cover is the most proximate to the external light), the diffuse reflection is substantially reduced in the visible region, in particular, in the shorter wavelength portion (<450 nm).

Figure 6A:
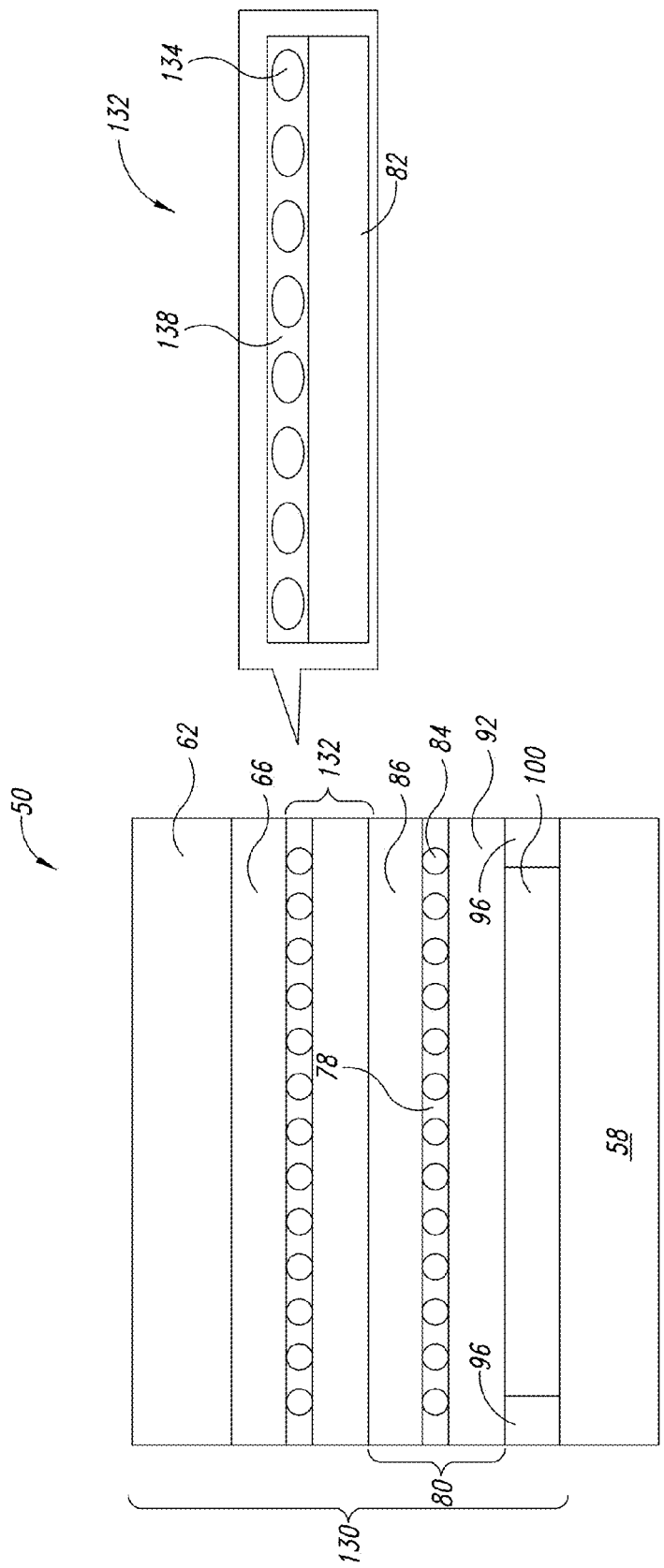
FIG. 6A shows an optical stack with a magnified view of a nanostructure-based conductive film.

In other embodiments, various configurations of the nanostructure-based conductive film of an optical stack are explored. Referring to FIG. 6A, an optical stack (130) is shown with a magnified view of a conductive film (132). The optical stack otherwise resembles the one in FIG. 3. The conductive film (132) comprises a nanostructure layer having a plurality of conductive nanostructures (134) distributed in an insulating medium (138) and a substrate (82). In various embodiments, the insulating medium is a binder, which is a part of a coating composition ("ink") for forming the conductive film. More specifically, the nanostructure-based conductive film is formed by coating on a substrate the coating formulation comprising the nanostructures, a suitable binder and optionally one or more surfactants. Many coating methods can be utilized, including screen printing, slot-die coating, spin-coating (see co-pending and co-owned U.S. Published Patent Application No. 2007/0074316). The binder facilitates the coating process to provide dispersion of the nanostructures and adhesion to the substrate. As described in further detail herein, the binder is optically clear and may be a polymeric material, including hydroxypropyl methyl cellulose (HPMC).

Figure 6B:
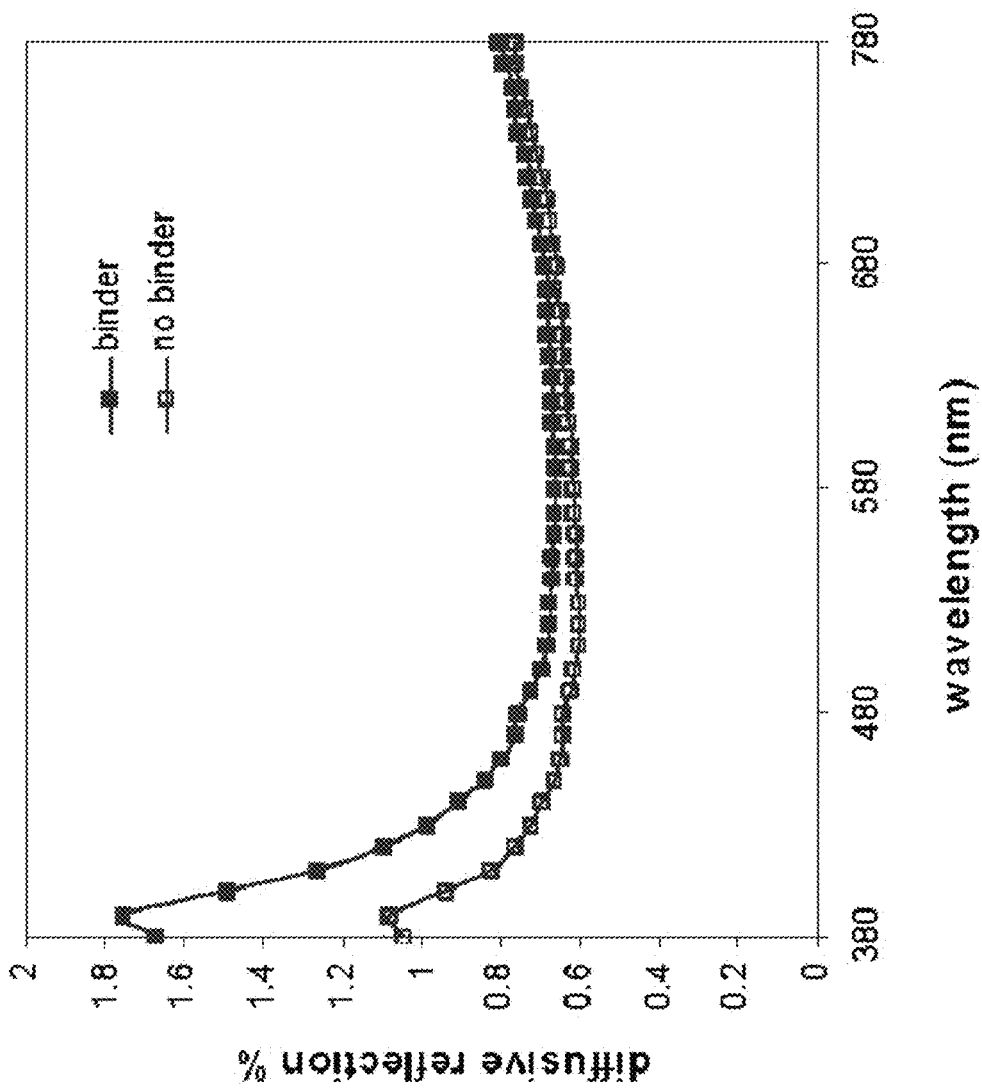
FIG. 6B shows the comparative results of diffuse reflections in conductive films with and without a binder.

In general, diffuse reflection may be reduced when the medium surrounding the nanostructure has a low refractive index. The optical effect of the binder on diffuse reflection is shown in FIG. 6B. When the binder is removed (e.g., washed away), thus effectively replacing the surrounding medium (binder) with air, the diffuse reflection is substantially lowered as compared to when it is present. Thus, in one embodiment, the insulating medium is air, which has the lowest refractive index. Although it is possible to form the nanostructure-based conductive film without the binder in the coating composition, it is typically a process concern that a binder be present. Thus, in order to obtain air as an insulating medium, the binder can be coated and subsequently removed.

While removing the binder reduces diffuse reflection, in most circumstances, it is impractical to have air as the insulating medium surrounding the nanostructures. In other words, a certain amount of the binder may be necessary to ensure the physical integrity of the conductive film. In addition, the nanostructures benefit from having a protection layer and in some situations require one. Thus, even if the binder is removed for the purpose of reducing diffuse reflection, a subsequent protection layer may reverse the result. Nevertheless, an insulating medium should have as low a refractive index as possible. Thus, in another embodiment, the conductive film is first formed with a binder, followed by removing the binder and coating with an insulating medium that has a refractive index of less than that of the binder. In a specific embodiment the insulating medium has a refractive index of 1.45 or less.

Figure 6C:
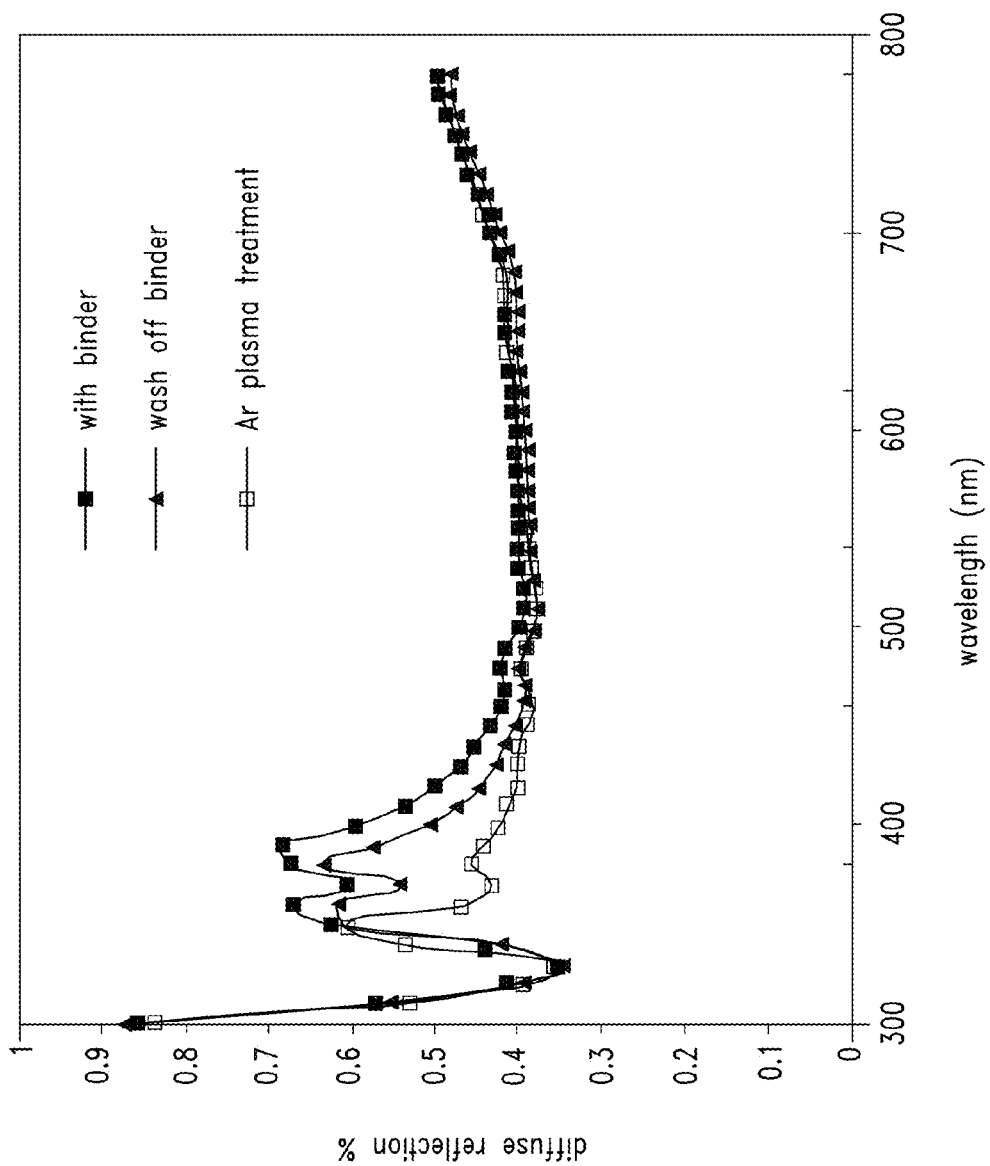
FIG. 6C shows the comparative results of diffuse reflections in conductive films with a binder, as compared to a conductive film in which the binder has been removed by washing and a conductive film that has been plasma treated.

In another embodiment, diffuse reflection can be substantially lowered by a plasma treatment of the nanostructure layer. The plasma treatment not only removes the binder but also removes any coating on the nanostructures that is remnant from the synthetic preparation of the nanostructures. For instance, as discussed in Example 1, nanowires are prepared in a solution-based "polyols" approach. The nanowires prepared in this way may be coated, at least partially, with a thin layer of polyvinylpyrrolidone (PVP), an organic molecule having a refractive index of 1.51. Thus, diffuse reflection may be reduced by a plasma treatment as it effectively removes all media surrounding the nanostructures, including the binder as well as any organic coating on the nanostructures. Shown in FIG. 6C are diffuse reflections of samples of nanostructure layers coated on glass. As shown, the diffuse reflection is reduced when the binder is washed away (consistent with FIG. 6B). The diffuse reflection is further substantially reduced, especially at the visible region (380 nm), when the sample is subjected to an argon plasma treatment, suggesting that the removal of the PVP coating on the nanostructures further contributes to the reduction of diffuse reflection. Thus, a further embodiment provides a method of reducing diffuse reflection in an optical stack having a nanostructure layer that includes a plurality of interconnecting nanostructures and a binder, wherein individual nanostructure has an organic coating, the method comprising plasma treating the nanostructure layer. In certain embodiments, plasma treating removes the binder and the organic coating on the nanostructures.

Plasma treatment is particularly effective in removing a binder and an organic coating from a nanostructure layer coated on a glass substrate. The power of plasma is typically in the range of 50-300 W, and the run time of 0.5-3 minutes. For organic substrates such as polyethylene terephthalate (PET) and triacetylcellulose (TAC), however, the power of the plasma treatment should be no more than 150 W because a higher plasma power may generate organic debris from the substrate, and the debris is likely to be re-deposited on the nanostructures.

In addition to plasma treatment (e.g., by argon), water wash, UV light exposure or UV-ozone are also effective in at least partially removing the PVP coating. Diffusion reflection is reduced as a result.

Organic coatings on nanostructures can be beneficial to their stability or dispersibility. Thus, as an alternative to the plasma treatment that completely removes the organic coating (e.g., PVP), another embodiment provides a method of reducing diffusion reflection by displacing a first high-index organic coating on the nanostructures with a second low-index organic coating. In particular, an organic coating with a lower index may be incubated with the PVP-coated nanostructures. Typically, the lower index organic coating is based on an organic substance that has an affinity for a metallic surface. Suitable low-index organic substances include, for example, fluorosurfactants. In a particular embodiment, the low-index organic coating comprises an anionic fluorosurfactant, commercially available under the trade name of ZONYL®FSA by DuPont. At a sufficient concentration of the lower-index organic molecule and incubation time, the PVP coating can be displaced by the low-index coating. The nanostructures with the low-index coating can then be formed into conductive network by the methods described herein. Because ZONYL® FSA FSA has a refractive index of 1.38, nanostructures coated with the same can form a transparent conductor with a lower diffusion reflection when compared to a transparent conductor made from PVP-coated nanostructures.

Figure 6D:
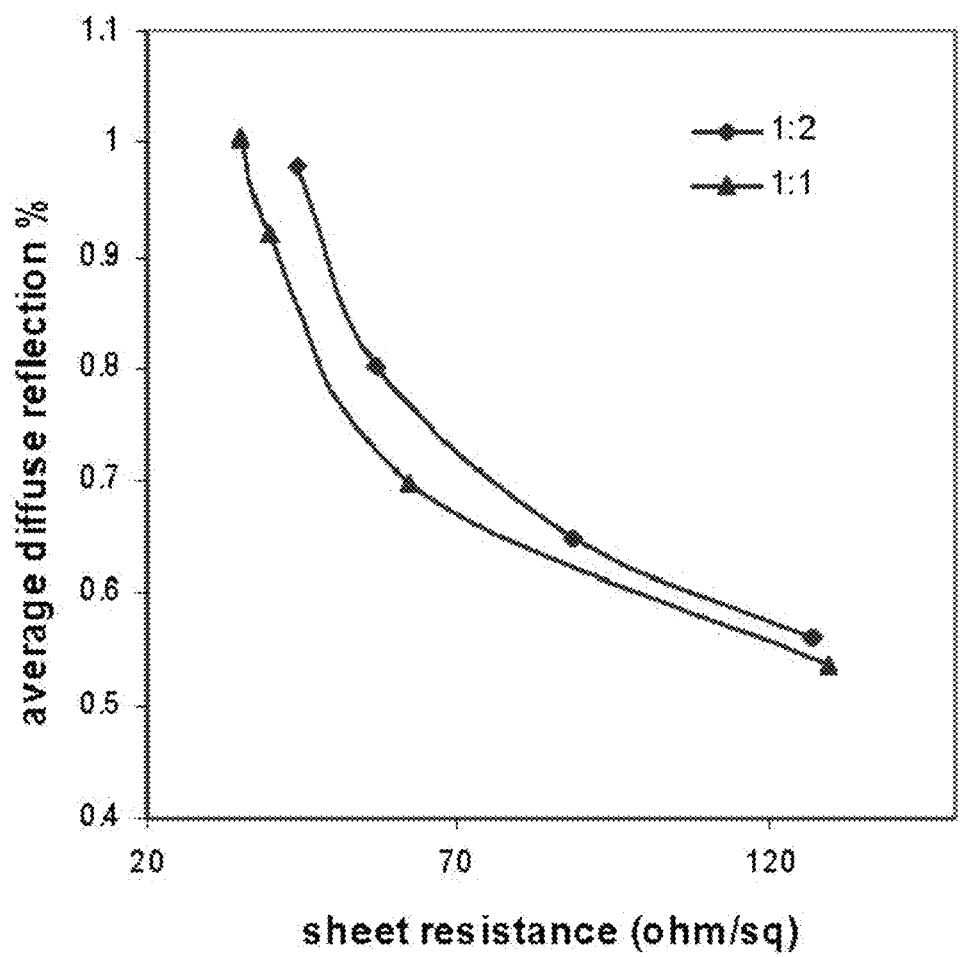
FIG. 6D shows the comparative results of diffuse reflections in conductive films with different nanostructure/binder ratios.

In an alternative embodiment to selecting a low refractive index insulating medium (e.g., air or a lower-index organic coating), adjusting the relative amount of the nanostructures to the insulating medium may reduce the diffuse reflection. FIG. 6D shows diffusion reflections of conductive films, both having a nanostructure layer on a glass substrate. The nanostructure layers include, respectively, silver nanowires and HPMC binder at 1:1 ratio and 1:2 ratio. As shown, the conductive film in which silver nanowires and HPMC binder are at 1:1 ratio has a lower diffuse reflection as compared to the conductive film of 1:2 ratio.

Figure 6E:
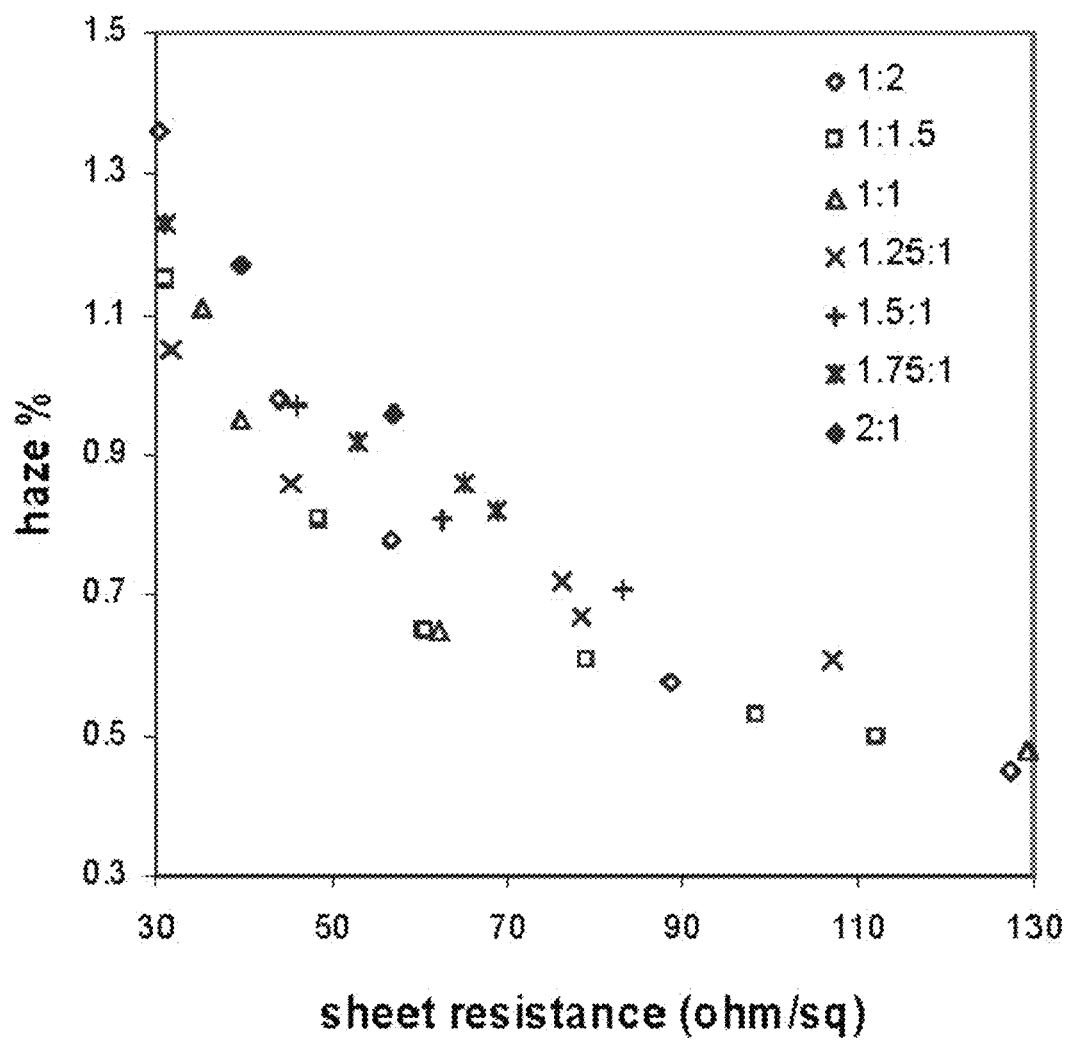
FIG. 6E shows the comparative results of hazes in conductive films with different nanostructure/binder ratios.

However, adjusting the relative amount of the nanostructures to the insulating medium should be balanced against concerns for other optical properties, such as haze. FIG. 6E shows the haze of various conductive films comprising silver nanowires and HPMC binder on a glass substrate. As shown, a relative ratio of 1:1 (nanostructures:binder) gives the lowest haze. For ratios higher than 1:1, when there is more nanostructures than binder, silver nanowires tend to aggregate, which would cause an increase in haze. In addition, at ratios higher than 1:1, more film defects may result. Thus, for conductive films formed of silver nanowires and HPMC binder, a weight ratio of 1:1 or less results in acceptable diffusion reflection as well as haze.

Figure 6F:
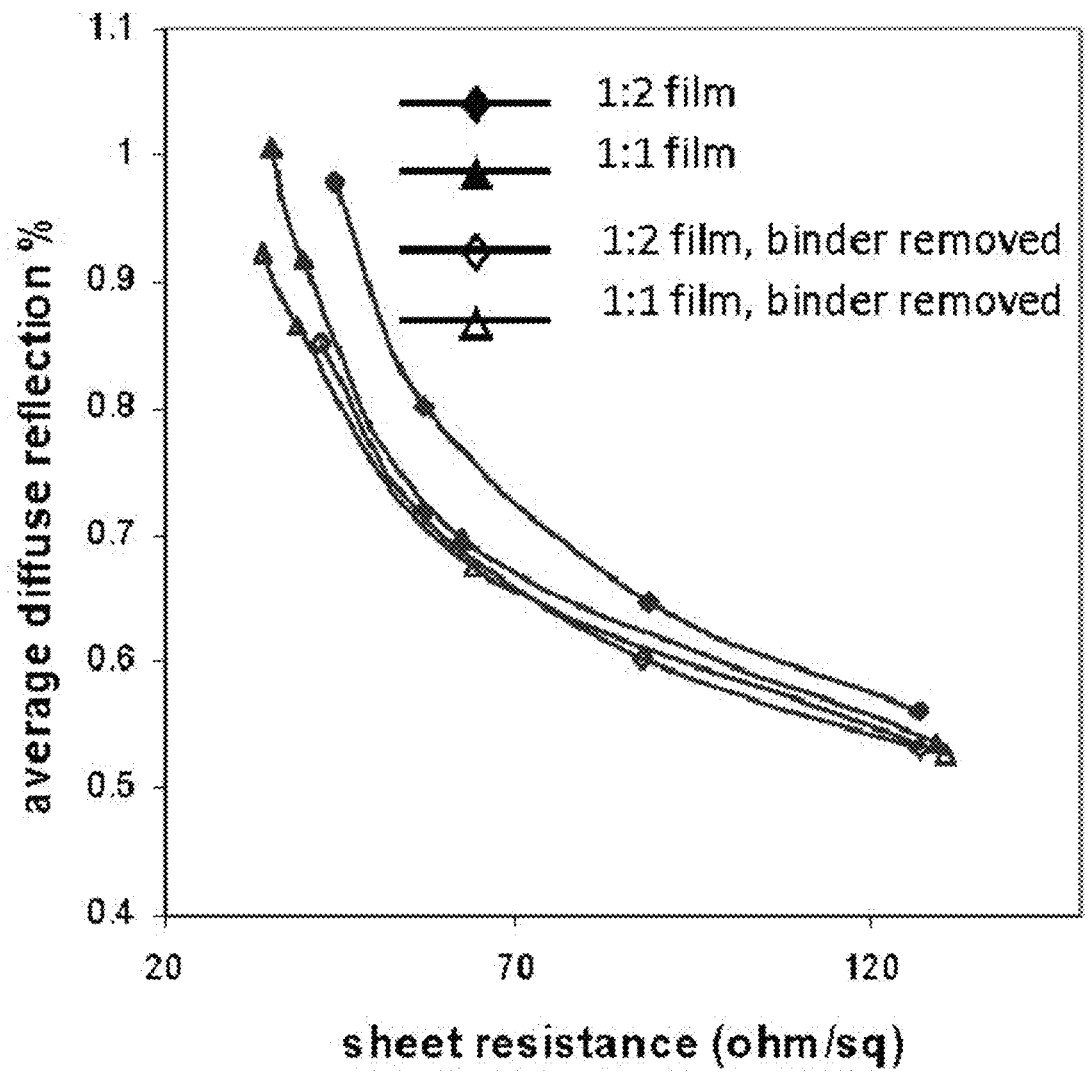
FIG. 6F shows diffuse reflections of conductive films with different nanostructure/binder ratios as compared to the same conductive films with the binder removed.

In certain circumstances, adjusting the ratio of the nanostructures relative to the binder may achieve a comparable level of reduction of diffuse reflection as removing the binder all together. FIG. 6F shows that adjusting the silver nanowires and HPMC ratio from 1:2 to 1:1 causes a reduction in diffuse reflection. As the binders in both films are removed, the levels of diffuse reflections for both films (without binders) are substantially comparable to the lower diffuse reflection of the film having a 1:1 ratio.

Figure 6G:
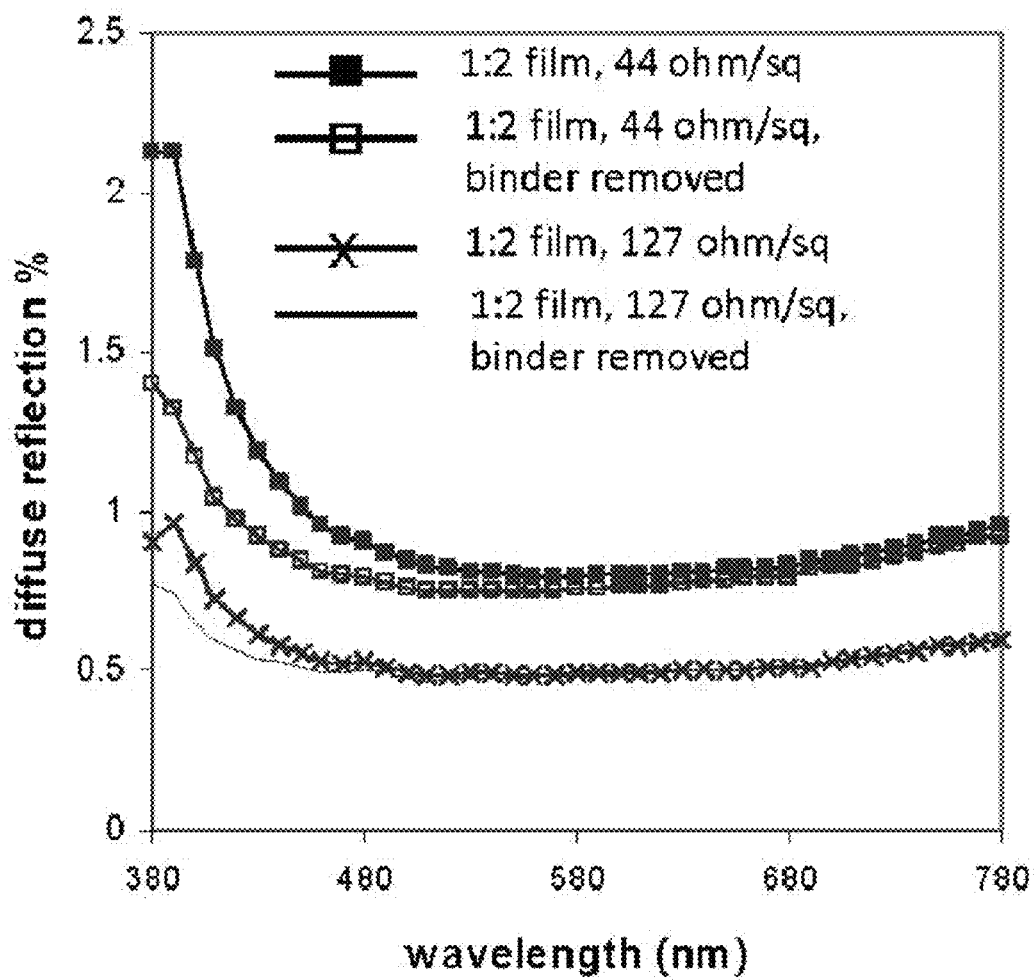
FIGS. 6G and 6H show the comparative results of diffuse reflections of conductive films of different sheet resistances as well as different nanostructure/binder ratios.
Figure 6H:
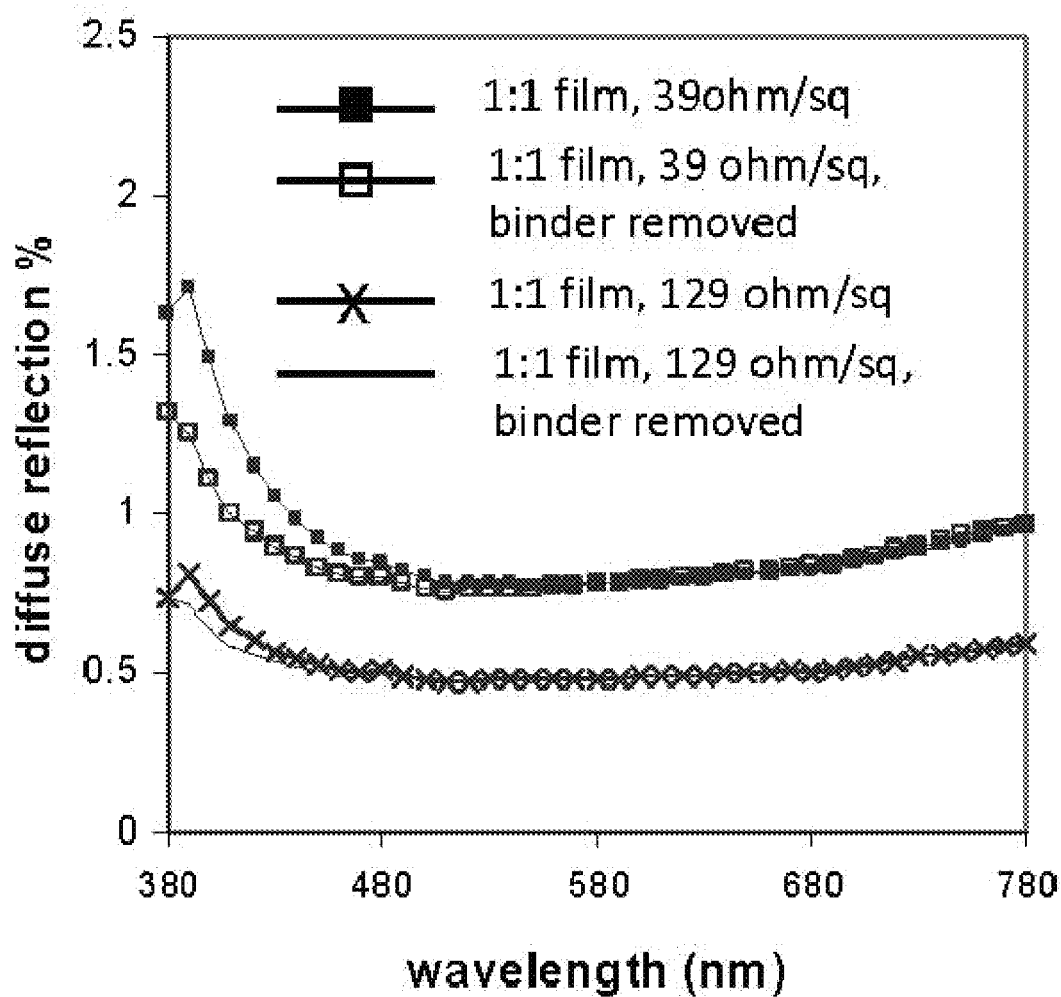

It should be noted that, depending on the surface resistance (which correlates to the amount of nanostructures per unit surface area), the impact of the amount of the binder on the diffuse reflection may vary. FIG. 6G shows the diffuse reflections of two conductive films having sheet resistances of 44 ohms/sq and 127 ohms/sq, respectively. Both films have the same ratio of silver nanowires to HPMC binder (1:2). For the 44 ohms/sq film, which has more nanostructures per unit surface area, and thus more light scattering, removing the binder causes a significant reduction of the diffuse reflection. For the 127 ohms/sq film, the initial diffuse reflection is lower than that of the 44 ohms/sq film due to less light scattering (i.e., fewer nanostructures per unit surface area). However, the removal of the binder has little impact on the diffuse reflection. FIG. 6H shows a similar trend in two conductive films, both of which have a ratio of the silver nanowires and the HPMC binder of 1:1. Compared to the 39 ohms/sq film, the impact of the HPMC binder in the 129 ohms/sq film is very little. In other words, removing HPMC would not have improved the diffuse reflection for conductive films that have sheet resistance of over 100 ohms/sq. Thus, one embodiment provides an optical stack comprising a transparent conductive film, which includes a nanostructure layer coated on a substrate, the nanostructure layer having a plurality of silver nanowires and an HPMC binder, wherein the silver nanowires and the HPMC are at a weight ratio of 1:1, and wherein the nanostructure layer has a sheet resistance of less than 100 ohms/sq.

Figure 7A:
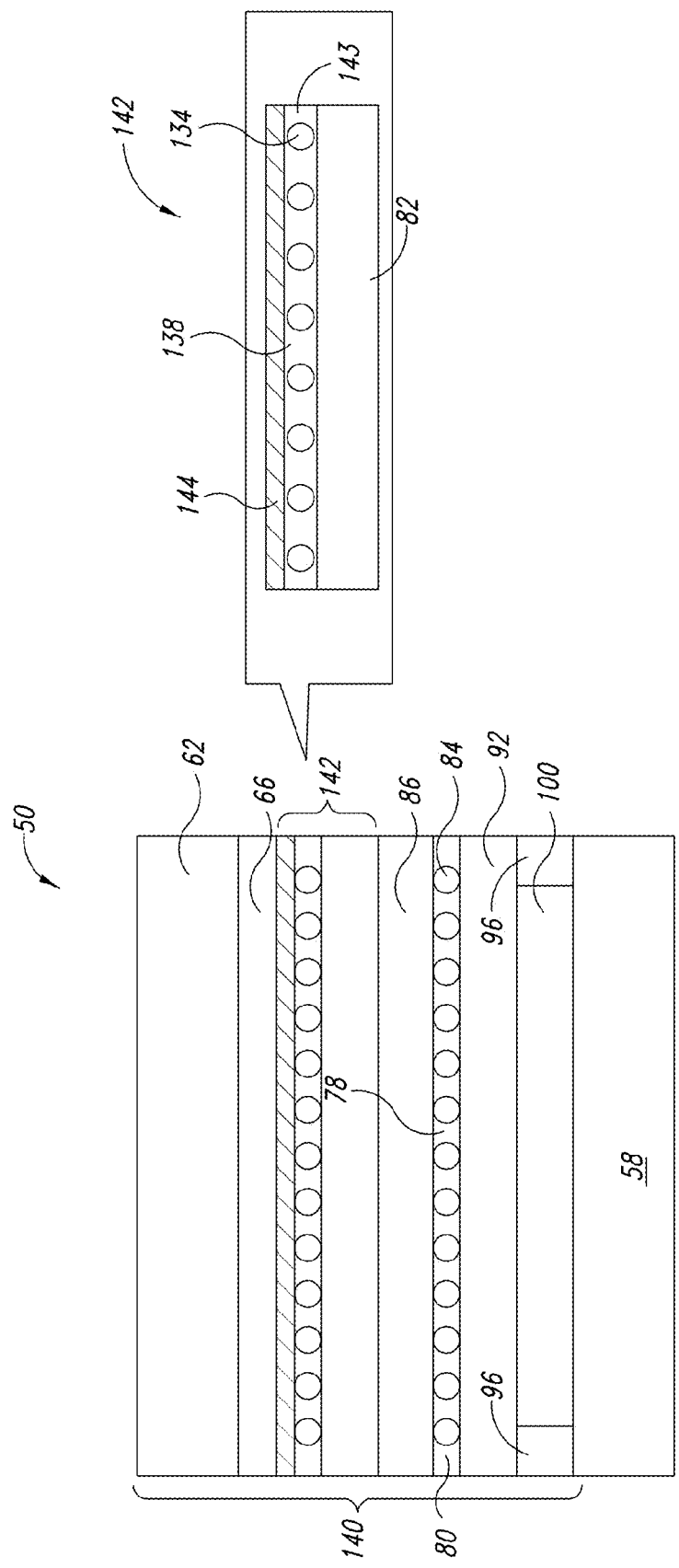
FIG. 7A shows an optical stack with a magnified view of a nanostructure-based conductive film, which includes an overcoat.

In other embodiments, layers immediately above the nanostructure-based conductive film may have a significant impact on the optical behaviors of the light traveling within the optical stack. It has been found that the diffuse reflection can be reduced if light travels from a lower index material to a higher index material. Referring to FIG. 7A, an optical stack (140) is shown with a magnified view of a conductive film (142). The optical stack otherwise resembles the one in FIG. 3. The conductive film (142) comprises a nanostructure layer (143) including a plurality of conductive nanostructures (134) distributed in an insulating medium (138), a substrate (82), and an overcoat (144). The overcoat (144) is a separate coating overlying the nanostructure layer (143) and, in some circumstances, is necessary for protecting the nanostructures. The overcoat is, using the external light (or the viewer) as a reference, always more proximate to the external light (or the viewer) than the nanostructure layer. The overcoat can be the same or different material from the insulating medium (e.g., binder) of the conductive film. As with the binder, the overcoat should have as low a refractive index as possible and practical.

Figure 7B:
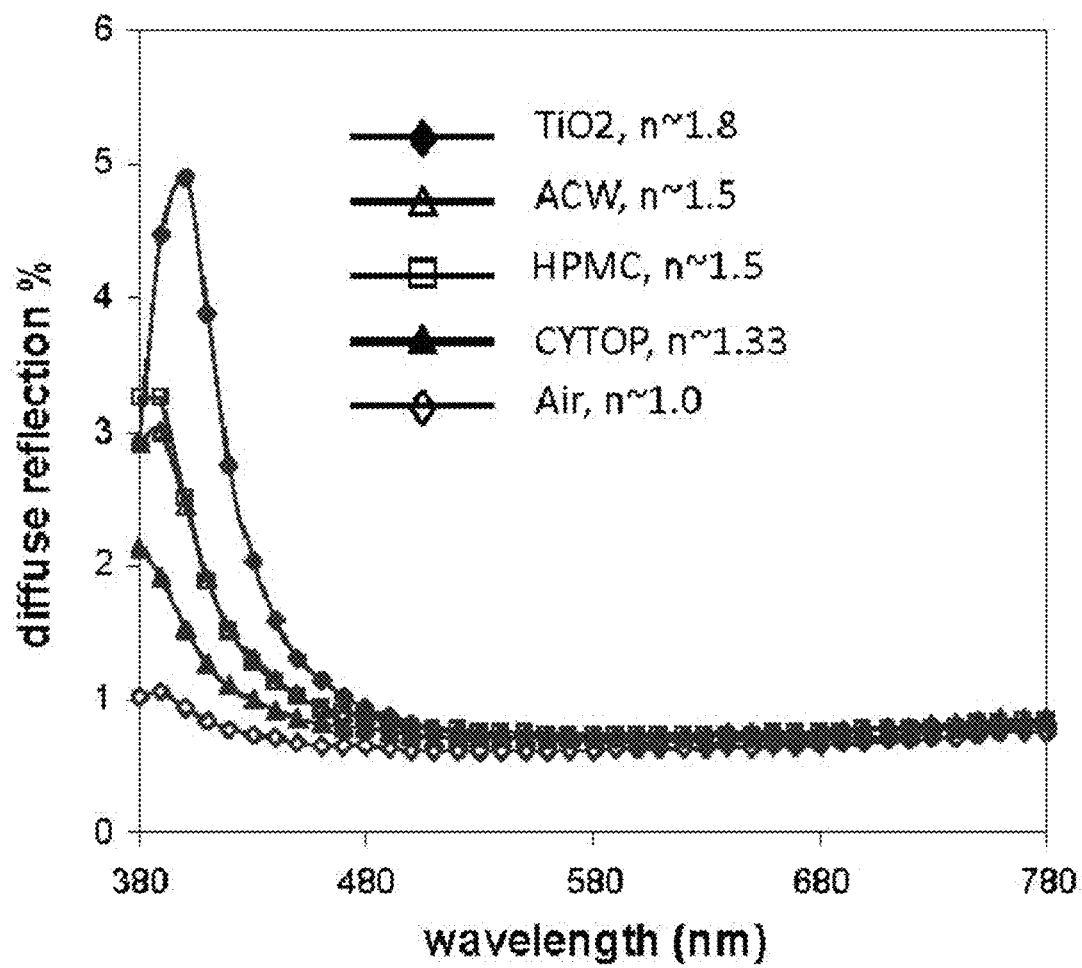
FIG. 7B shows the comparative results of diffuse reflections of conductive films with various overcoats.
Figure 7C:
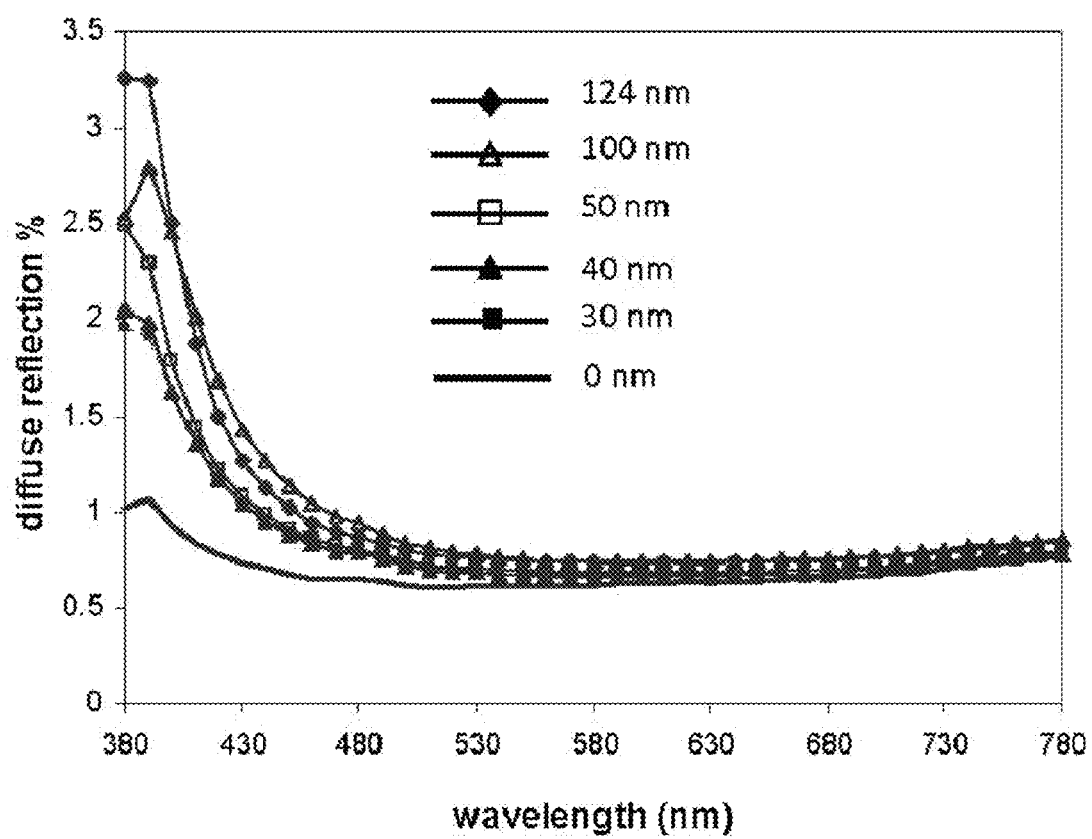
FIG. 7C shows the comparative results of diffuse reflections of conductive films having an HPMC overcoat at various thicknesses.

FIG. 7B shows the diffuse reflections of a conductive film (nanostructure layer on a glass substrate) with a number of different overcoats. In general, the nanostructure layer was first formed on the glass, followed by removing the binder by washing. Thereafter, various overcoats were coated on the nanostructures at various thicknesses. As the refractive index decreases from 1.8 ($TiO_2$) to 1 (i.e., no overcoat/air only), the diffuse reflection decreases. For a given overcoat material (e.g., HPMC), the diffuse reflection is not necessarily in a linear correlation with the thickness of the overcoat (FIG. 7C). In other words, to minimize diffuse reflection, an optimum thickness may be selected for a low refractive index overcoat. In various embodiments, the thickness may be less than 150 nm, or less than 100 nm, or less than 50 nm, or less than 30 nm.

As used herein, unless specified otherwise, a "low-index" layer (e.g., an overcoat, an insulating medium, an organic coating of the nanostructure) typically has a refractive index of less than 1.55, or less than 1.5. In certain embodiments, a low-index layer has a refractive index of 1.45 or less, or 1.35 or less, or 1.30 or less, or 1.25 or less. Unless otherwise specified, the refractive indices described herein are based on measurements taken at yellow doublet sodium D line, with a wavelength of 589 nm.

Table 1 shows a number of low refractive index materials that are suitable as overcoats.

TABLE 1

| Overcoat Materials (Vendor) | Refractive index | Curing Methods | Chemical Identity/components |
|---|---|---|---|
| CYTOP (Asahi Glass) | 1.33 | Thermal (180° C.) | Amorphous Fluoropolymer |
| 3M 4880 (3M) | 1.34 | Thermal (room temperature for 24 hrs or 130° C. for 15 min) | Fluoropolymer |
| MY-132 (MY Polymer) | 1.32 | UV(1-2 J/cm2, 300-400 nm) | Acrylic resin |
| Hyflon AD 40(Solvay) | 1.33 | Thermal (50-150° C.) | Amorphous perfluoropolymers |
| TU2205 (JSR) | 1.35 | UV (300 mJ/cm$^2$) | Fluororesin + acrylate monomer + silica nanoparticles |
| LAL-2020 (TOK) | 1.21 | Thermal (100-200° C.) | Acrylic resin + silica nanoparticles |
| LAL-N6034 (TOK) | 1.34 | UV (200 mJ/cm$^2$) | |

Thus, in certain embodiments, the low-index overcoat is a polymeric material. In particular, the polymeric material may be a fluoropolymer, including for example, amorphous fluorocarbon polymers. In a specific embodiment, amorphous fluoropolymers that include a cyclic ring structure in the monomer may be used (e.g., CYTOP® by Asahi Glass). These fluoropolymers are soluble in organic solvent and are compatible with solution-based coating (e.g., spin coating or slot-die coating).

In other embodiment, the low-index overcoat is a thin film having porous nanoparticles embedded in a binder. The porous nanoparticles effectively introduce air into the overcoat, thereby lowering its refractive index. Suitable porous nanoparticles may have a plurality of pores that are isolated or interconnected with each other. In certain embodiments, the porous nanoparticles are mesoporous nanoparticles with pore sizes ranging from 1 nm to 50 nm. Alternatively, it is also contemplated that the porous nanoparticles may each have a single internal void or pore, for example, in a bubble or shell structure.

Regardless of the geometry of the pores, the porous nanoparticles typically have an internal void volume of 50-90%. As used herein, the internal void volume refers to the fraction of the volume of the voids over a total volume of the nanoparticles. The total volume of a given nanoparticle depends on its diameter, assuming the nanoparticles are spherical or substantially spherical. Preferably, the nanoparticles have a narrow diameter distribution with mean particle diameter varying from 10 to 100 nm.

The porous nanoparticles are typically made of a low-refractive index material. In one embodiment, the porous nanoparticles are silica particles, including mesoporous silica particles. Porous silica particles are known in the art and are typically synthesized from tetraalkyl orthosilicates, using a sol-gel or spray drying method. Alternatively, template-directed synthesis provides porous particles with tunable pore sizes. A specific example of suitable porous silica nanoparticles is commercially available under the trade name of LAL-2020 (Tokyo Ohka Kogyo Co. Ltd.).

The binder of the low-index overcoat can be any transparent polymeric binder having a refractive index of no more than 1.55. In certain embodiments, the binder is a UV or thermal curable acrylic resin or polyurethane. Some commercial sources of the porous particles may already have been combined with a binder. For example, LAL-2020 is a dispersion of silica nanoparticles (<5 wt %) and an acrylic resin binder (<1 wt %) in a solvent. Although such dispersion is generally ready to form films, additional binder may be added to adjust the ratio of the binder and the nanoparticles of the final dry film.

The ratio of the nanoparticle and binder in the overcoat can impact the optical properties of the overcoat. Depending on the total amount of the void or air that can be introduced into the overcoat, the refractive index of an overcoat with porous nanoparticles may be as low as 1.22. As a result, an optical stack incorporating the same can achieve a low diffusion reflection of less than 2.2%, or less than 2% or less than 1.8%.

Lowering the refractive index should be balanced against other optical criteria for the overcoat. For example, care should be taken to avoid increasing the haze or lowering the transparency of the overcoat. In certain embodiments, the amount and size of the porous nanoparticles are such that the haze of the overcoat is less than 1.5%, or more preferably less than 1%, and the transmission is at least 90%, or at least 92%, or more preferably at least 93%.

The ratio of the nanoparticle and binder in the overcoat can also be optimized to enhance the mechanical properties of the overcoat. Unlike fluopolymers, acrylic and polyurethane are UV-curable hard coat resins. Thus, low-index overcoats incorporating porous nanoparticles can benefit from the mechanical robustness of the binder. Depending on the relative amount of the nanoparticles and the binder, the low-index overcoats can attain a desired level of durability while maintaining a low refractive index.

In various embodiments, the nanoparticles are present in the overcoat (as a dry film) at about 20-80% in volume, or more specifically about 20-70%, or 20-60%, or 20-50%, or 20-40%, or 20-30%, or 30-70%, or 30-60%, or 30-50% or 30-40%, or 40-70%, or 40-60% or 40-50%, or 50-70% or 50-60%, or 60-70% or 60-80%.

Figure 7D:
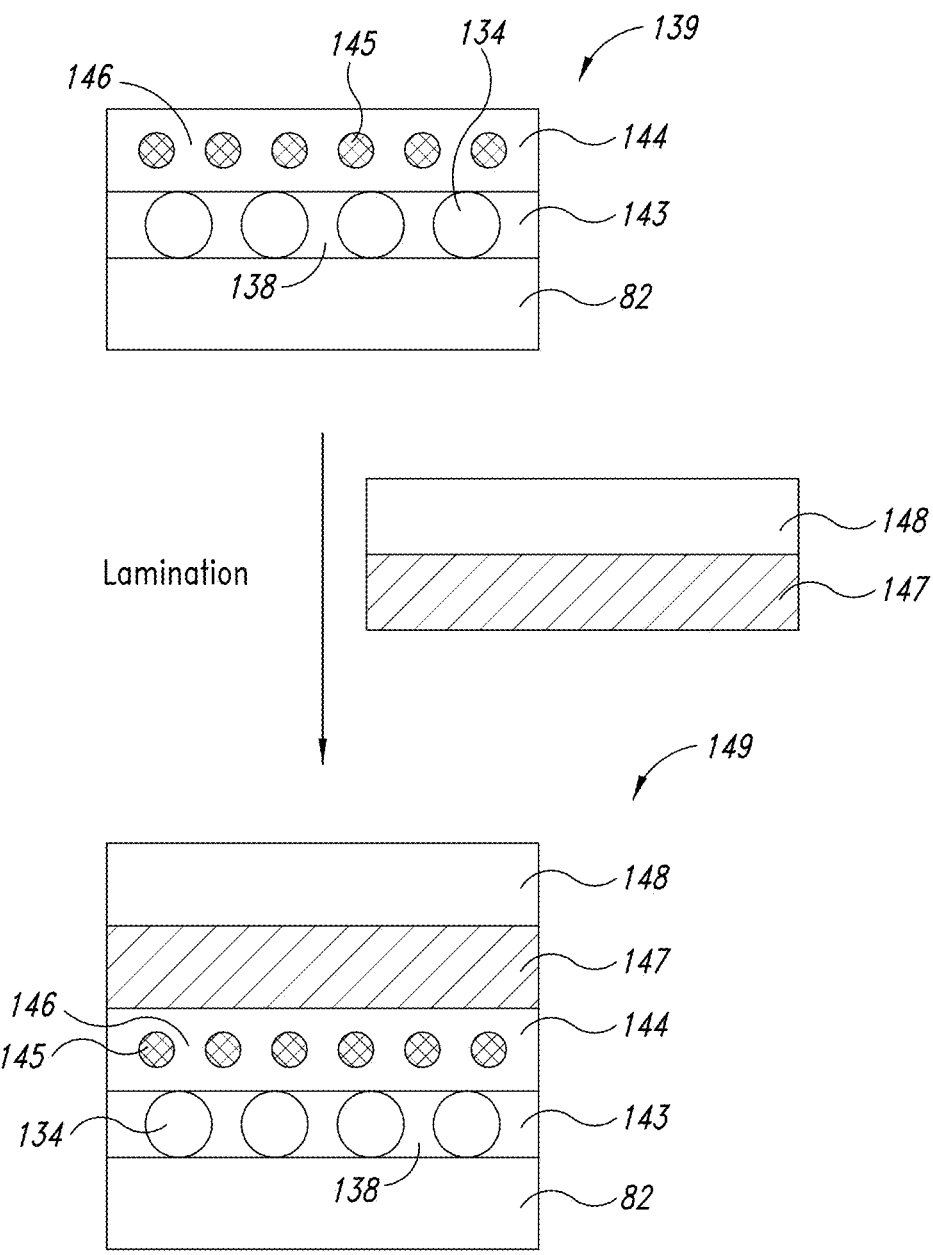
FIG. 7D shows an optical stack comprising a low-index overcoat that includes a plurality of porous nanoparticles.

FIG. 7D illustrates a process of incorporating a low-index overcoat in an optical stack. A basic optical stack (139) is formed by first forming a nanostructure layer (143) on a first substrate (82) (e.g., PET). The nanostructure layer (143) includes a plurality of nanostructures (134) embedded in an insulating medium or binder (138). An overcoat layer (144) is then formed on the nanostructure layer (143), the overcoat layer comprising a plurality of porous nanoparticles (145) and a binder (146). The overcoat layer is typically formed by coating a dispersion of porous nanoparticles on the nanostructure layer followed by curing (e.g., by UV or thermal means). Production concerns may require that the curing temperatures of the overcoat be below certain degrees to avoid damaging the underlying nanostructure layer. The basic optical stack has a diffuse reflection of less than 2.2%, or less than 2% or less than 1.8%. The basic optical stack (139) can thereafter be laminated onto a second substrate (148) via an OCA layer (147) to provide a final optical stack (149).

As an alternative to a low-index overcoat, a low-index OCA having a refractive index of 1.45 or less may be used. While a standard OCA (e.g., 3M™ OCA) has a refractive index of 1.47, low-index OCA ($R_D$=1.45 or less) performs the dual functions of providing a low-index layer and bonding. As discussed in further detail below, a low-index OCA may be laminated on a first basic optical stack and bonded with a second basic optical stack. Suitable low-index OCAs include, for example, silicone-based OCA ($R_D$=1.41) commercially available under the trade name Arclear® 8932EE by Adhesive Research, and PS-133 ($R_D$=1.33) of MY Polymer.

Figure 8A:
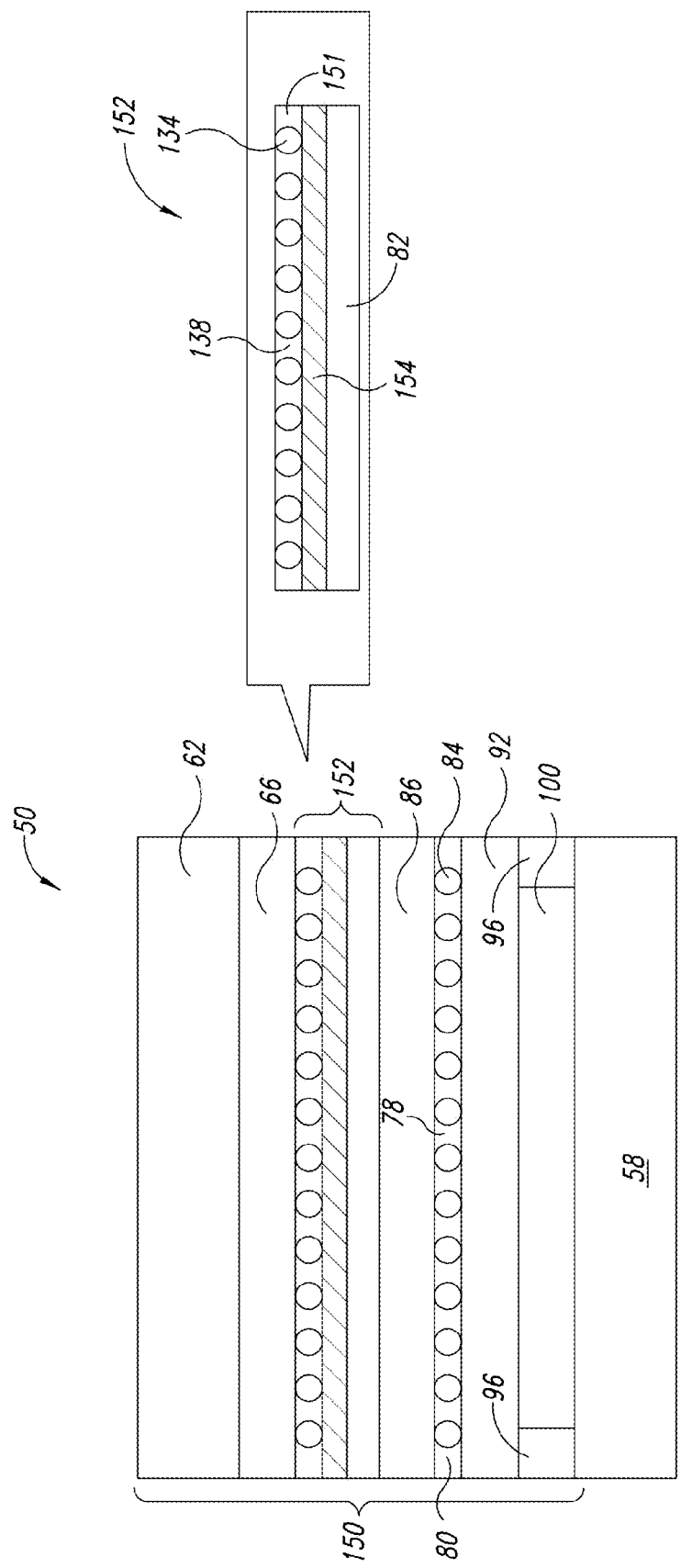
FIG. 8A shows an optical stack with a magnified view of a nanostructure-based conductive film, which includes an undercoat.

In other embodiments, layers immediately below the nanostructure-based conductive film may also have significant impact on the optical behaviors of the light traveling within the optical stack. Consistent with the finding that the diffuse reflection can be reduced if light travels from a lower index material to a higher index material, a high refractive index material can be used as an undercoat. Referring to FIG. 8A, an optical stack (150) is shown with a magnified view of a conductive film (152). The optical stack otherwise resembles the one in FIG. 3. The conductive film (152) comprises a nanostructure layer (151) which includes a plurality of conductive nanostructures (134) distributed in an insulating medium (138), an undercoat (154), and a substrate (82). The undercoat (154) is a separate coating underlying the nanostructure layer (151). The undercoat is, using the external light (or the viewer) as a reference, always farther away from the external light (or the viewer) than the nanostructure layer.

Figure 8B:
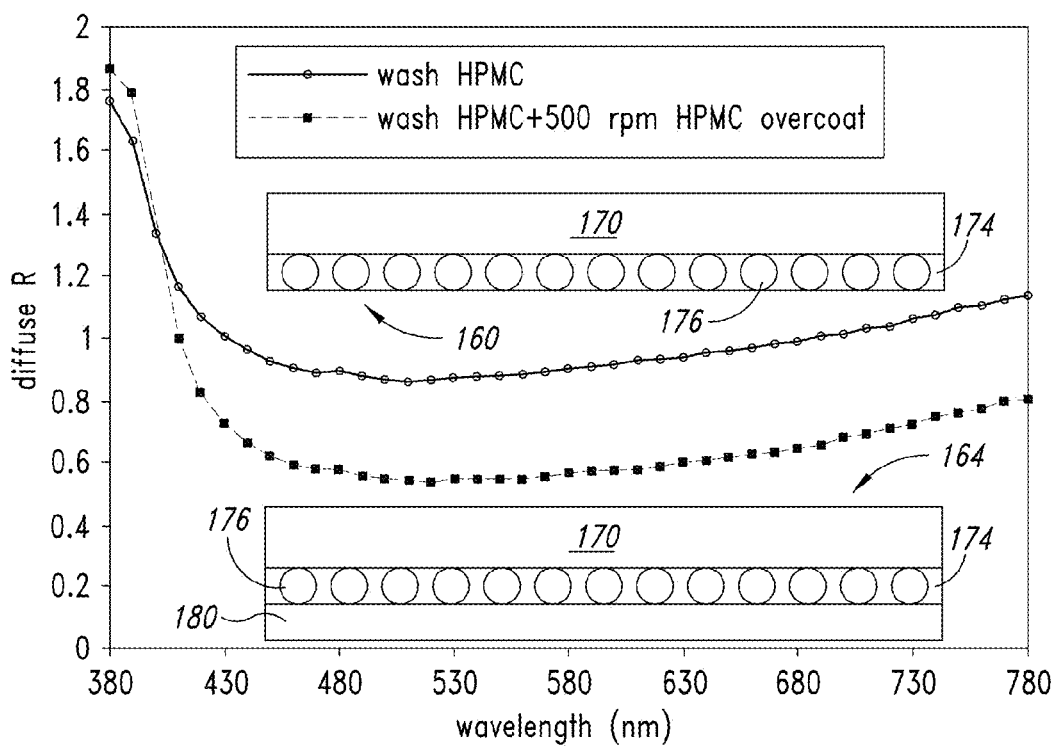
FIGS. 8B-8D show the comparative results of diffuse reflections of conductive films with and without a high-index undercoat.

In one embodiment, the undercoat has a higher refractive index than the binder and/or higher than the substrate (i.e., the layer underlying the undercoat). FIG. 8B shows the diffuse reflections of conductive films (160) and (164). Conductive film (160) comprises a glass cover (170) and a nanostructure layer (174). The nanostructure layer (174) has no binder (i.e., the binder is removed after film formation), thus having air as an insulating medium ($R_D=1$). The nanostructure layer (174) also has no undercoat, i.e., the nanostructure layer is exposed to air ($R_D=1$). Conductive film (164) comprises a glass cover (170), a nanostructure layer (174) with conductive nanostructures (176) and an undercoat layer (180), e.g., an HPMC layer. Viewing from the glass side, the diffuse reflection of the conductive film (164) is much lower than that of the conductive film (160), owing to the presence of a high-index undercoat layer (HPMC has a higher refractive index than air).

Figure 8C:
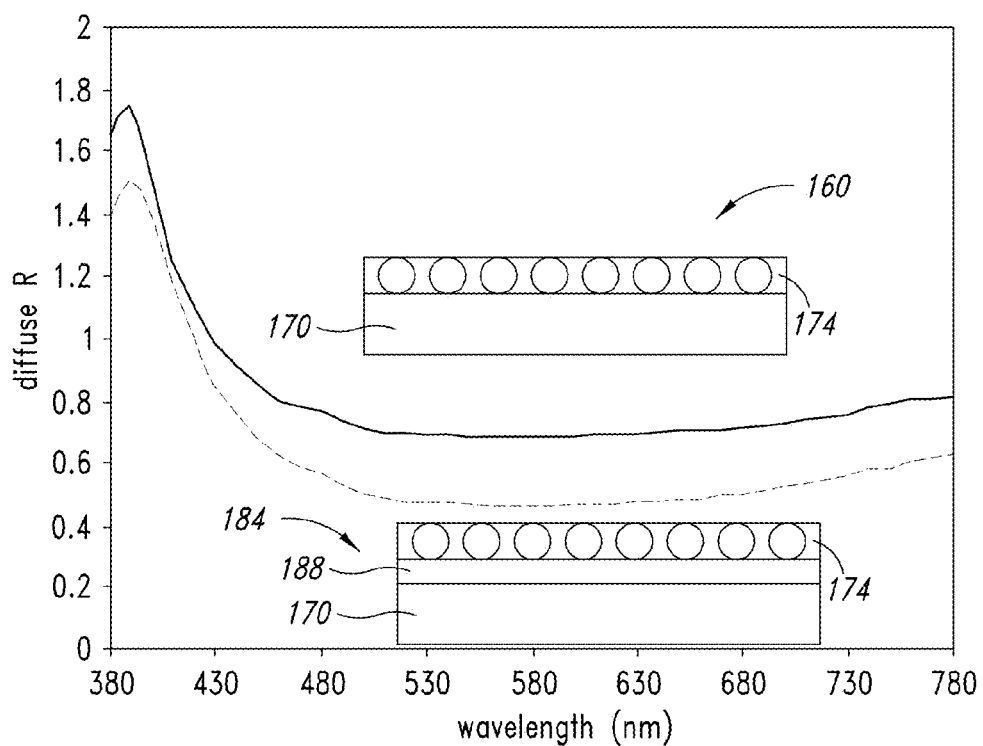

To further illustrate the optical impact of the undercoat, FIG. 8C shows the diffuse reflection of a conductive film (160) when viewed from the nanostructure layer side. Here it is compared with a conductive film (184) which comprises an undercoat (188) immediately underlying the conductive film and overlying the glass substrate (170). The undercoat is $TiO_2$ ($R_D=1.8$), which is higher than the substrate glass ($R_D=1.5$). It can be observed that the diffuse reflection is lower in the conductive film (184) having a $TiO_2$ undercoat.

Figure 8D:
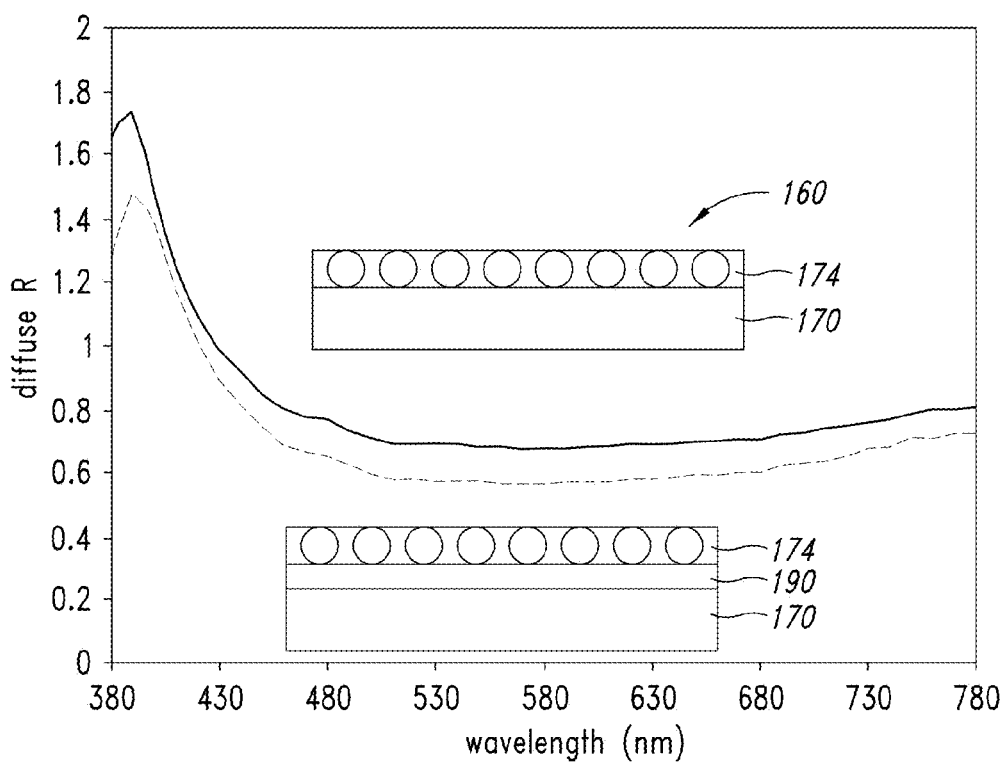

Likewise, FIG. 8D shows that having a polyimide undercoat (190) ($R_D=1.7$) also reduces the diffuse reflection as compared to the conductive film in which the undercoat is absent.

Figure 8E:
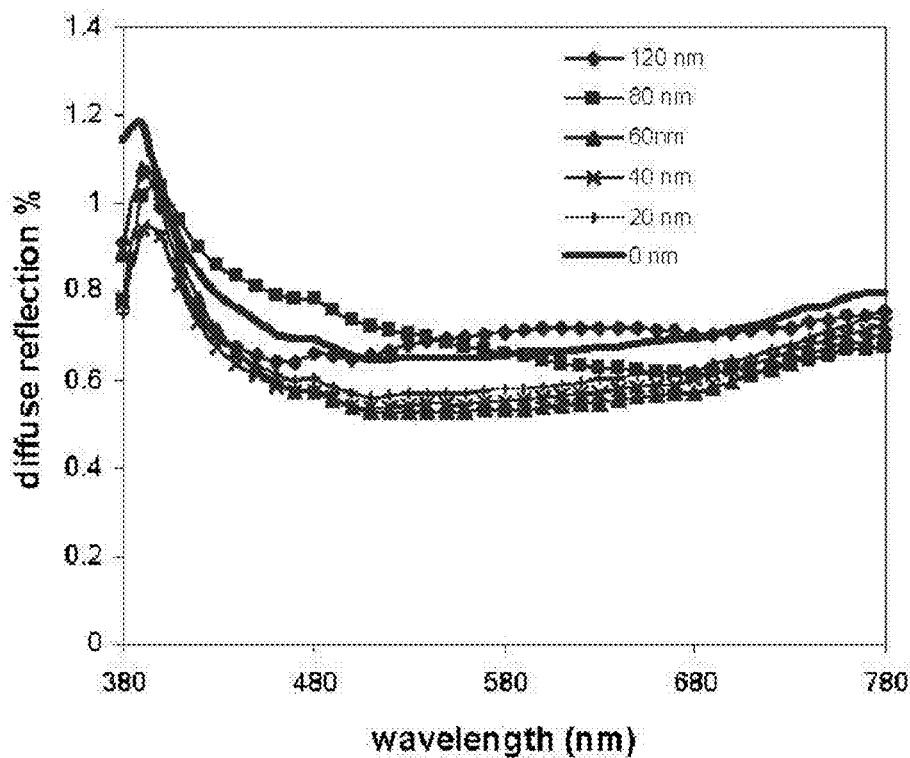
FIG. 8E shows the comparative results of diffuse reflections of conductive films including an undercoat at various thicknesses.

As with the overcoat, for a given undercoat material (e.g., $TiO_2$), the diffuse reflection is not necessarily in a linear correlation with the thickness of the undercoat (FIG. 8E). In other words, to minimize diffuse reflection, an optimum thickness may be selected for a high refractive index undercoat. In various embodiments, the thickness may be less than 150 nm, or less than 100 nm, or less than 50 nm, or less than 30 nm.

The undercoat layer is typically formed first on a substrate (e.g., glass or PET), followed by coating the ink composition to form the conductive film. Table 2 shows a number of high refractive index materials that are suitable for undercoat. Production concerns may require that the curing temperatures of the undercoat be below certain degrees to avoid damaging the underlying substrate.

TABLE 2

| Materials/Vendor | Refractive Index | Curing methods | Chemical Identity/components |
|---|---|---|---|
| Titanium(IV) isopropoxide | 1.8-2.2 | Thermal (140-200° C.) | $TiO_2$ precursor ($R_D$ depends on the curing temperature) |
| PI2545 (HD Microsystems) | 1.7-1.8 | Thermal (230° C.) | Polyimide |
| OptiNDEX ™ D1 (Brewer science) | 1.85 | Thermal (250° C.) | Polyimide |
| OptiNDEX ™ A54 (Brewer Science) | 2.15 | Thermal (300° C.) | Organic-inorganic hybrid coating |
| Seramic SI-A ($SiO_2$ film) (Gelest) | 2.1-2.1 | Thermal/UV (350° C./<240 nm) | Silicon dioxide precursor |
| HAL-2080 (TOK) | 1.80 | Thermal (200° C.) | Acrylic resin + silica nanoparticles |
| HAL-N4076 (TOK) | 1.76 | UV + thermal (300 mJ/cm² + 200° C.) | nanoparticles + titanium dioxide ($TiO_2$) nanoparticles |
| KZ6661 (JSR) | 1.65 | UV (1 J/cm²) | acrylate monomer + $ZrO_2$ (RI ~2.13) particles |
| UR101 (Nissan chemical) | 1.76 | UV (800 mJ/cm²) | Triazine polymer mixtures |

Figure 9A:
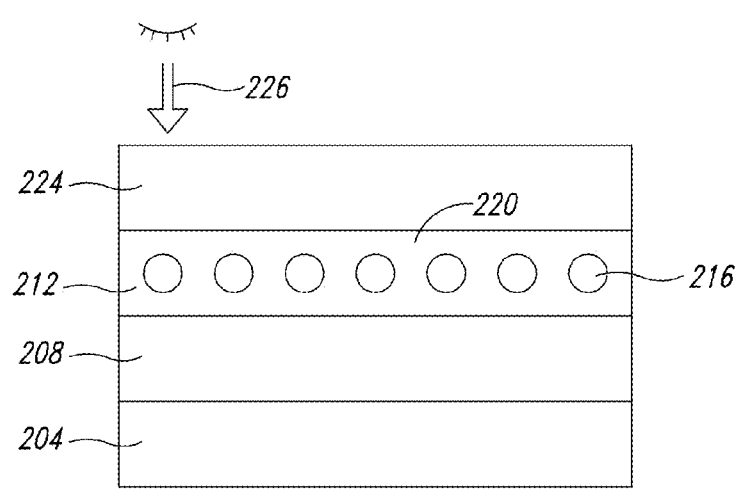
FIGS. 9A-9C show various configurations of conductive films, each including an overcoat as well as an undercoat.

In a further embodiment and with reference to FIG. 9A, both an overcoat and undercoat are present in a conductive film (200). More specifically, the conductive film (200) comprises a substrate (204), an undercoat (208), a nanostructure layer (212) having nanostructures (216) embedded in an insulating medium (220), and an overcoat (224). The overcoat has a first refractive index, the insulating medium has a second refractive index, the undercoat has a third refractive index, and the substrate has a fourth refractive index. In order to minimize the diffuse reflection of incident light (226), the light should travel from a low refractive index film to the same or a higher refractive index film in those films that are immediately adjacent to the conductive film. Thus, the first refractive index is the same or less than the second refractive index, which in turn is less than the third refractive index. The third refractive index is higher than the fourth refractive index.

Figure 9B:
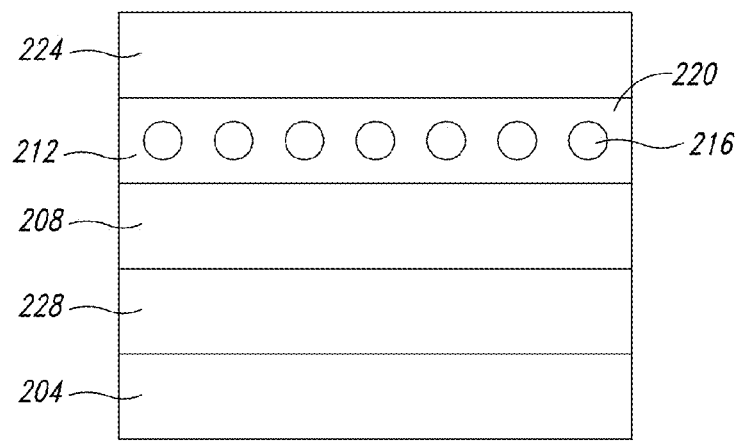

Optionally, as shown in FIG. 9B, an intermediate layer (228) may be interposed between the substrate and the high-index undercoat. The intermediate layer has a fifth refractive index, which is lower than the third refractive index (of the undercoat) as well as lower than the fourth refractive index (of the substrate). The intermediate layer can be beneficial if the substrate has a high refractive index (i.e., $R_D > 1.6$).

Figure 9C:
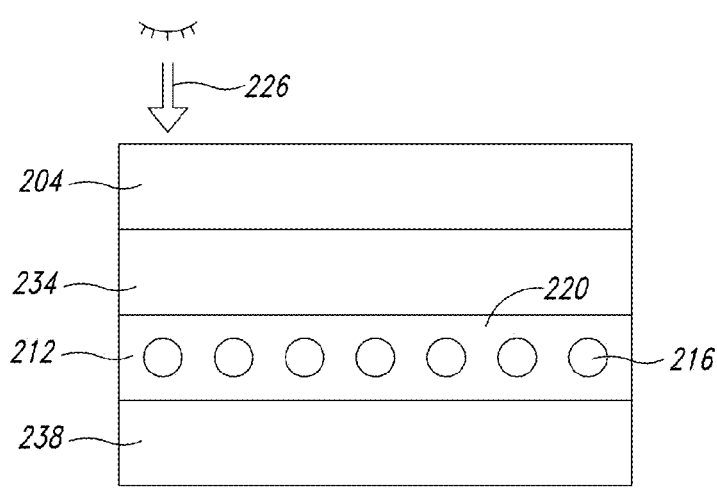

FIG. 9C illustrates that the conductive film orientation in relation to the external light (or the viewer) will affect the optical stack configuration. As shown, in an optical stack (230) that resembles the optical stack 200 of FIG. 9A, the substrate (204) is more proximate to the external light (226) than the nanostructure layer (212). To minimize diffuse reflection viewed from the same side of the optical stack as the external light, an overcoat (234) of low-index is interposed between the substrate (204) and the nanostructure layer (212). Alternatively or in addition, an undercoat (238) of high-index is immediately underlying the conductive film (212). Thus, the principle of allowing the light to travel from low-index layer to high-index layer in the vicinity of the nanostructure film remains regardless of the film orientation. However, when the film orientations are opposite as shown in FIGS. 9A and 9C, the optical stacks have different configurations. For instance, the film interposed between the substrate and the conductive film is the high-index undercoat in the FIG. 9A configuration, whereas the film interposed between the substrate and the conductive film is the low-index overcoat in the FIG. 9C configuration.

Figure 10:
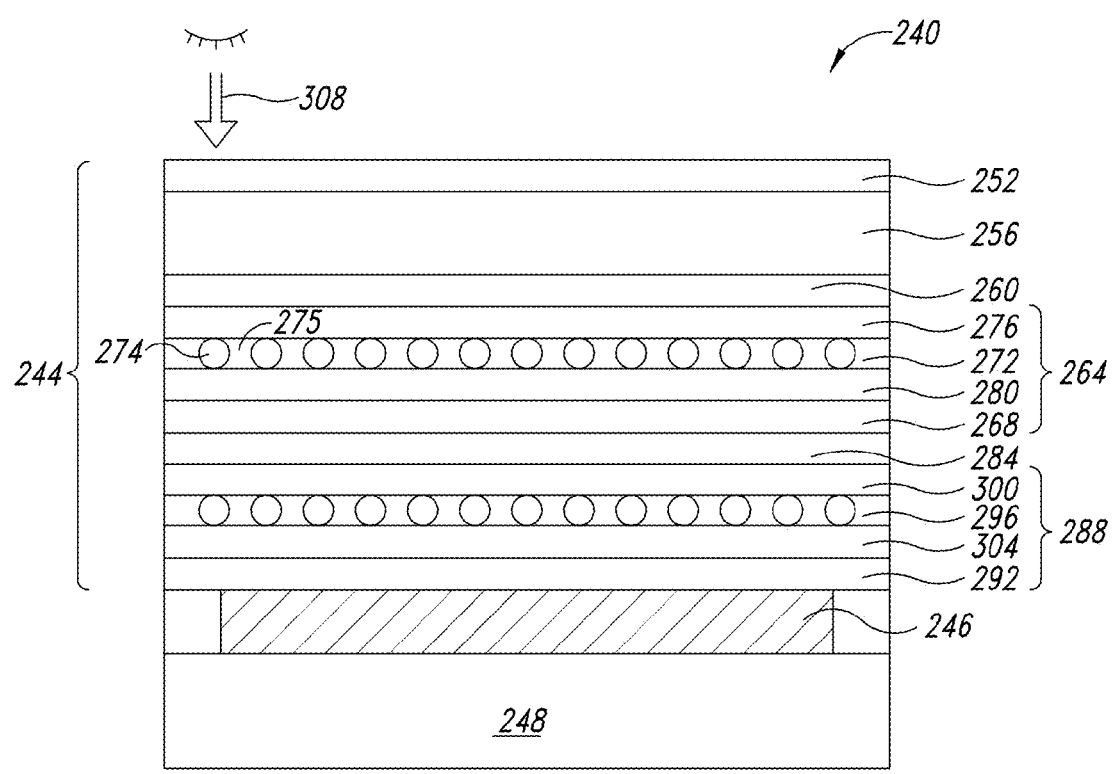
FIG. 10 shows an optical stack according to an embodiment of the present disclosure.

In a further embodiment, all the approaches to lowering diffuse reflection described above are combined in a single optical stack. As shown in FIG. 10, a touch screen display (240) includes an optical stack of a touch sensor (244), which is coupled to an LCD module (248) via an optically clear bonding layer (246). The optically clear bonding layer (246) can be of a liquid, semi-solid or solid material. The optical stack includes (from the top down) a high refractive index top cover (252); a glass cover (256); a first OCA layer (260); a first conductive film (264) including a first substrate (268), and a first nanostructure layer (272) flanked by an overcoat (276) and an undercoat (280), the nanostructure layer (272) in turn having a plurality of nanostructures (274) in an insulating medium (275); a second OCA layer (284); a second conductive film (288) including a second substrate (292) and a second nanostructure layer (296) flanked by an overcoat (300) and an undercoat (304).

Within the optical stack, the films are selected for their respective refractive indices to minimize the diffuse reflection of external light (308) as viewed from the same side of the optical stack as the external light. In particular, the outermost cover (252) has a higher refractive index than that of the glass cover (256). The overcoat (276) of the conductive film (264) has a same or lower refractive index than that of the insulating medium (275). The undercoat (280) has a higher refractive index than that of the insulating medium (275) as well as that of the first substrate (268).

In various specific embodiments, the outermost cover and the undercoats are "high-index" layers, i.e., having a refractive index of at least 1.65. For instance, each of the high-index layers can be the same or different and independently $TiO_2$, $SiO_2$, or polyimide. In other embodiments, the overcoat is a "low-index" layer, i.e., having a refractive index of less than 1.5. In further embodiments, the insulating medium can be air, or a low-index layer. In further embodiments, the nanostructures do not have an organic coating (e.g., PVP is removed by plasma treatment). In other embodiments, the nanostructures have a low-index organic coating.

Each layer of the optical stacks described herein can be coated or printed sequentially with precision control of the respective thicknesses. The coating method is particularly suited for a roll-to-roll process.

Figure 11:
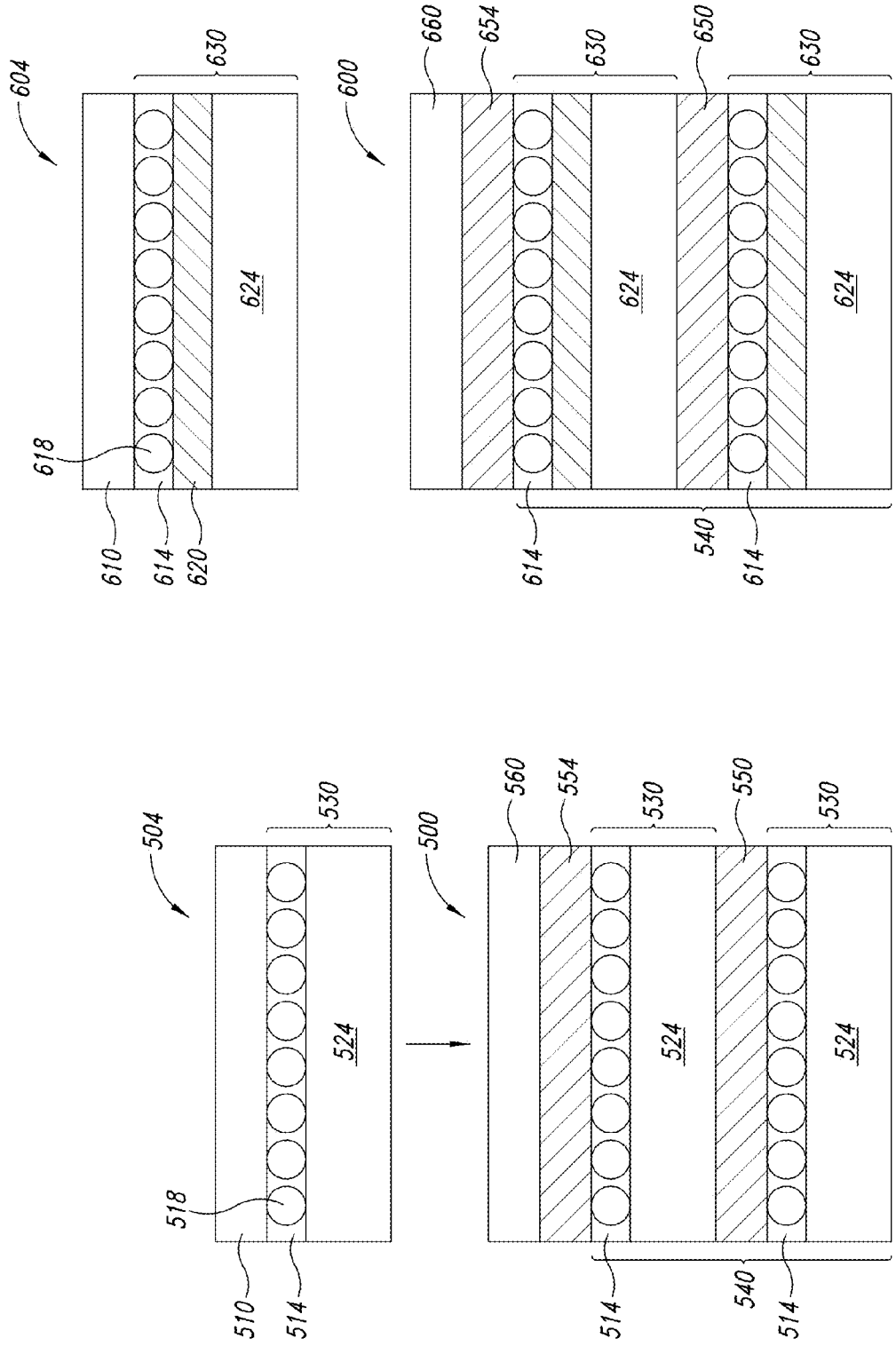
FIGS. 11A-11B show laminated touch panel sensor stacks according to an embodiment of the present disclosure.

An optical stack suitable as a touch sensor can also be fabricated by laminating two basic optical stacks. FIG. 11A shows such an optical stack (500). More specifically, the basic optical stacks are derived from a standard nanostructure-based transparent conductor (504), commercially available under the trade name ClearOhm™ by Cambrios Technologies Corporation. The standard transparent conductor (504) comprises, from top down, a protective overcoat (510), a nanostructure layer (514) having a network of conductive nanostructures (518), and a substrate (524). The substrate may be PET or glass. Other suitable transparent conductor structures are described in U.S. Pat. No. 8,049,333 in the name of Cambrios Technologies Corporation. Once the protecting coating (510) is removed, two basic stacks (530) may be laminated into a laminated stack (540). Advantageously, a low-index OCA having a refractive index of 1.45 or less (550) may be used to bond the two basic stacks (530). In addition to bonding, the low-index OCA also reduces diffuse reflection by providing a low-index overcoat for the nanostructure layer (514). The laminated stack (540) may be further laminated to another low-index OCA having a refractive index of 1.45 or less (554) that is bonded with a release layer or glass (560) to provide the final optical stack (500).

FIG. 11B shows another optical stack (600), in which the basic stack also includes a high-index undercoat. More specifically, a typical a nanostructure-based transparent conductor (604) comprises, from top down, a protective overcoat (610), a nanostructure layer (614) having a network of conductive nanostructures (618), a high-index undercoat (620) and a substrate (624). The substrate may be PET, glass or any suitable substrate as described in U.S. Pat. No. 8,049,333. Once the protecting coating (610) is removed, two basic stack (630) may be laminated into an optical stack (640). Similarly to FIG. 11A, a low-index OCA (650) is used to bond the two basic stacks (630). The laminated stack (640) may be further laminated to another low-index OCA (654) that is bonded with a release layer or glass (660) to provide the final optical stack (600).

Figure 12:
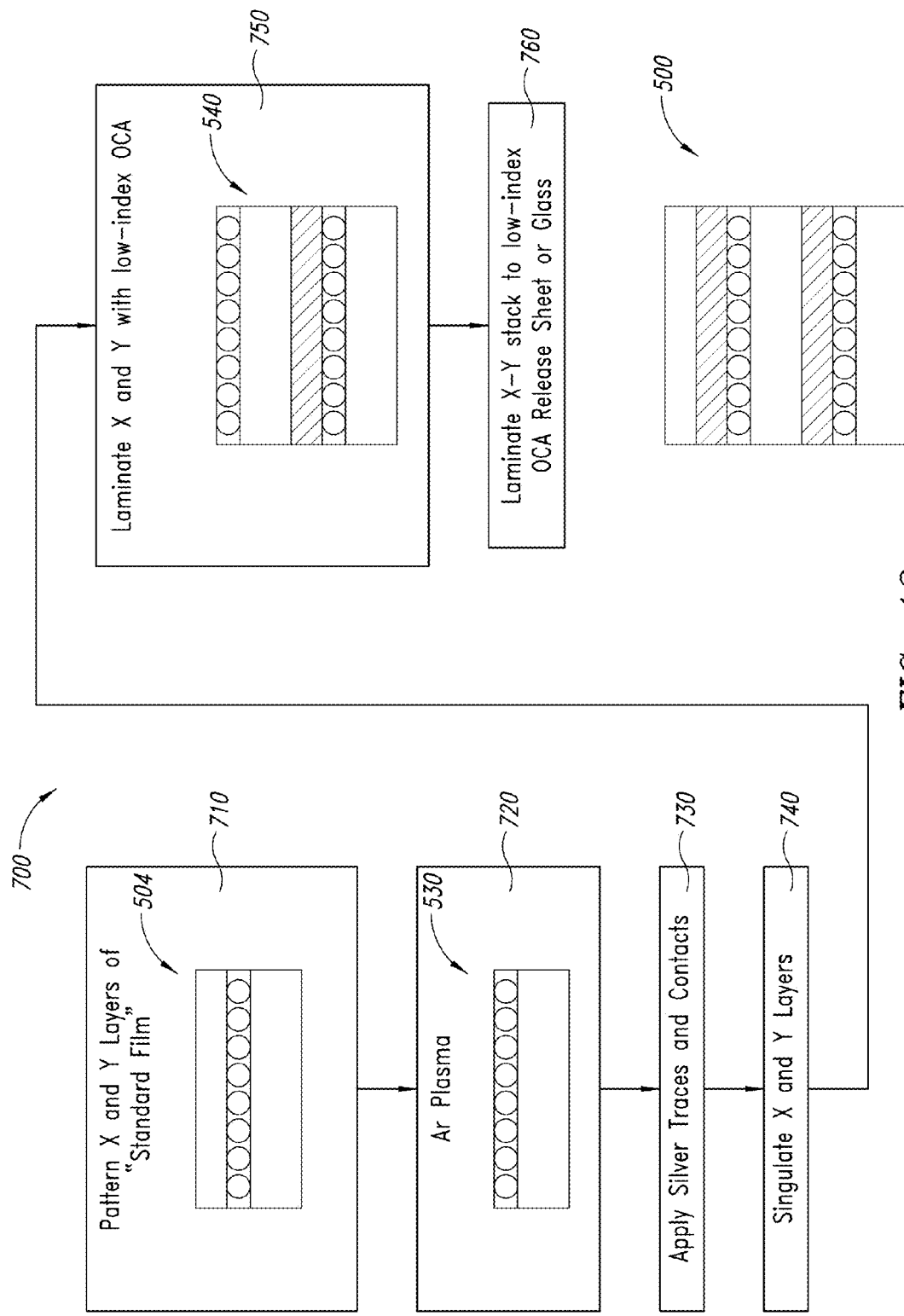
FIG. 12 shows a lamination process according to an embodiment of the present disclosure.

Using the laminated optical stack (540) as an example, FIG. 12 shows a lamination process (700) according to an embodiment. More specifically, a standard nanostructure-based transparent conductor (500) is first patterned into parallel conductive lines (not shown). For capacitive touch sensors, two patterned conductive layers are typically stacked such that the conductive lines in one conductive layer (X layer) are substantially perpendicular to the conductive lines in the other conductive layer (Y layer). The perpendicularly-arranged conductive lines thus form a grid for detecting the location of a touch input. The patterning (710) may be carried out by wet etching using a photoresist (e.g., SP photoresist by Dow Chemical). Thereafter, a plasma treatment step (720) is carried out to provide a basic stack (530) whereby the protecting coating (510) and any organic coating on the nanostructure (514) are removed. Step 730 forms metal trace (e.g., silver) and electrical contacts on the exposed nanostructure layer (514). Step 740 singulates the basic stack (530) into X and Y layers. Thereafter, step 750 laminates the X layer to the Y layer by a low-index OCA (550) having a refractive index of 1.45 or less to provide an X-Y stack (540). A final step (760) laminates the X-Y stack (540) to another low-index OCA layer (bonded to a release sheet or glass).

Thus, one embodiment provides a lamination process that comprises providing first and second basic optical stacks, each having a substrate and a nanostructure layer; laminating the first basic optical stack to the second basic optical stack with a low-index OCA having refractive index of 1.45 or less. In various embodiments, the first basic optical stack has a first plurality of substantially parallel conductive lines, the second basic optical stack has a second plurality of substantially parallel conductive lines, and laminating comprises bonding the first basic optical stack to the second basic optical stack such that the first plurality of substantially parallel conductive lines are substantially perpendicular to the second plurality of substantially parallel conductive lines. In other embodiments, the process further comprises forming metal traces and contacts prior to laminating.

In a further embodiment, diffuse reflection is reduced by reducing the light intensity at the nanostructure layer. As light propagates in a multilayer optical stack, depending on the refractive index and thickness of each layer, the light intensity varies along the optical path. Through calculation based on Maxwell equations, light intensity at a given location within an optical stack can be ascertained. Because the particulate nanostructures are the main cause of light scattering and diffuse reflection, in designing an optical stack, the location of the nanostructure layer should coincide with the lowest possible intensity of light in the optical path.

Figure 13A:
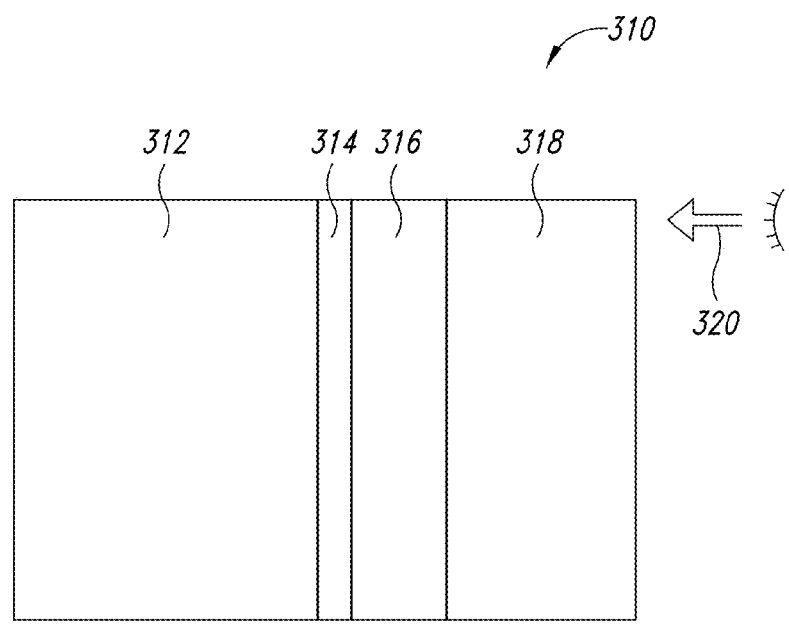
FIGS. 13A and 13B show optical intensity distribution in an optical stack.
Figure 13B:
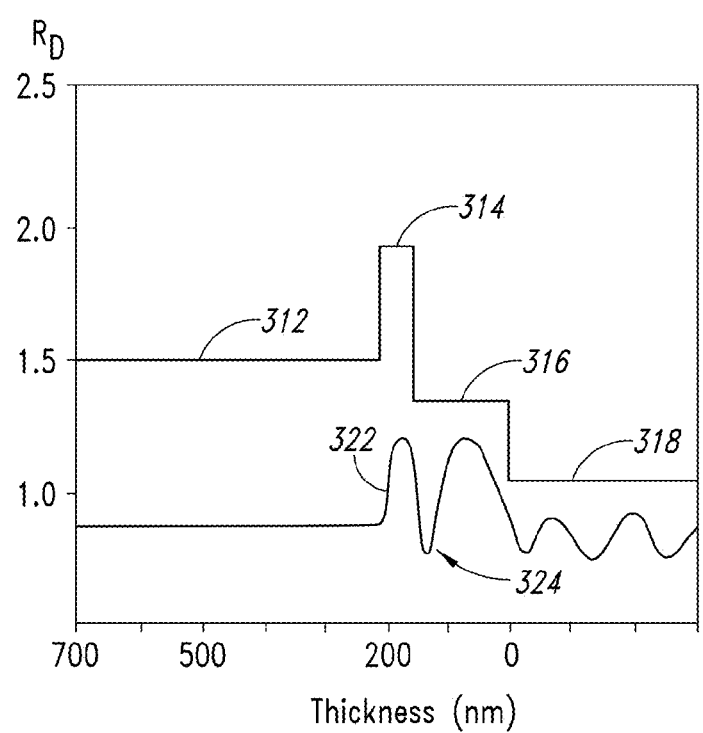

FIGS. 13A and 13B show positioning a nanostructure layer in an optical stack relative to light intensity. FIG. 13A shows an optical stack (310) that includes a glass substrate (312) ($R_D$=1.5), a high-index layer (314) of 50 nm thick ($R_D$=1.8), a low-index layer (316) of 150 nm thick ($R_D$=1.3) and air (318). FIG. 13A shows that light (320) enters the optical stack from the low-index layer side. Shown in FIG. 13B, given the data on the thickness and refractive index of each layer, light intensity ($\lambda$=550 nm was shown here) distribution (322) within the optical stack can be ascertained as a function of the thickness of the layers (from 0 to 200 nm). It should be understood that the air (318) extends from the optical stack to the right, whereas the glass substrate extends from the optical stack to the left (although only 500 nm of the glass is shown). FIG. 13B also shows the light distribution as a function of the refractive indices of the layers (including air). As shown, a low intensity of the light distribution (324) coincides with the interface between the high-index layer (314) and the low-index layer (316). Accordingly, positioning a thin nanostructure layer between the low-index layer and the high-index layer in optical stack (310) would have minimized the light intensity in the nanostructure layer, thus lowering the light scattering and diffuse reflection.

Figure 14A:
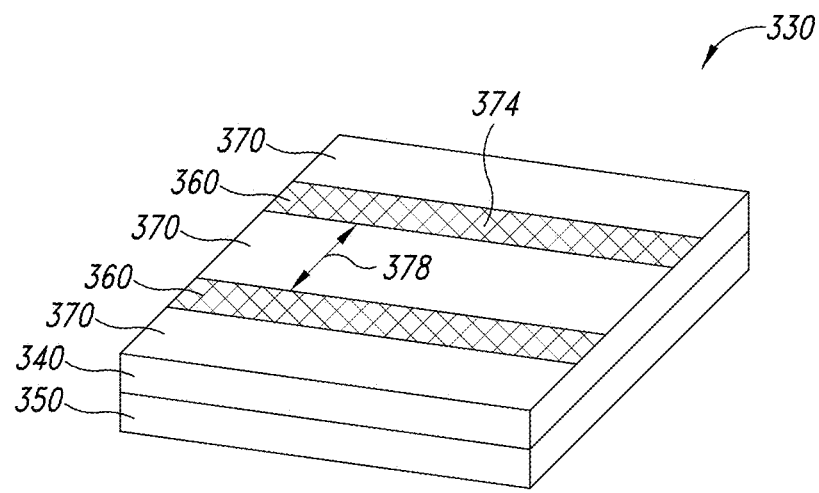
FIGS. 14A and 14B illustrate an embodiment in which a patterned conductive film may have low visibility patterns by incorporating a high-index undercoat.

In a further embodiment, patterns in the conductive film can appear less visible when steps are taken to reduce the diffuse reflection. As shown in FIG. 14A, a patterned conductive film (330) comprises a nanostructure layer (340) on a substrate (350), the nanostructure layer (340) including conductive regions (360) and non-conductive regions (370), the conductive regions having more nanostructures (374) than the non-conductive regions (e.g., when the non-conductive region is formed by fully etching the nanostructures therein). Thus, the conductive regions have more diffuse reflection due to more light scattering than that of the non-conductive regions, with the result that the pattern becomes visible by appearing "milkier" than the non-conductive regions.

The visibility of the pattern may correlate to the differentiations in sheet resistances between the conductive regions and the nearby non-conductive regions. Typically, the higher the differentiation in the numbers of the nanostructures between the conductive region and the non-conductive region, and the higher the differentiation in the scattered light from the two regions, the more visible the pattern becomes. In general, in patterned conductive films, the sheet resistance of the conductive region is at least $10^3$ more than the second sheet resistance of the non-conductive region. In addition, the visibility of the pattern may also vary depending on the relative sizes of the conductive and the nearby non-conductive region. In regular patterns as shown in FIG. 14A, a line gap (378) is a measure of the distance between two adjacent conductive regions, i.e., the width of the non-conductive region. Typically, the wider the line gap is, the more visible the pattern is.

Figure 14B:
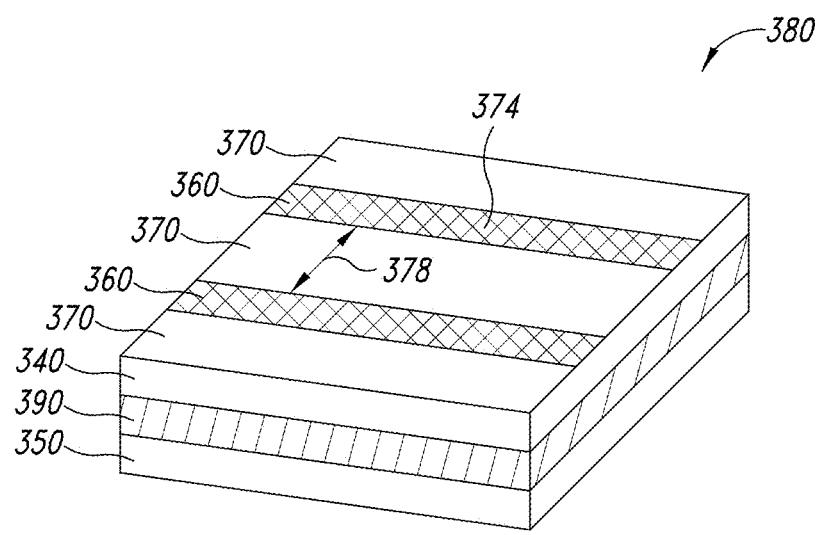

FIG. 14B shows a patterned conductive film 380 that includes an additional high-index layer (390) interposed between the nanostructure film (340) and the substrate (350). The high-index layer, i.e., an undercoat of the nanostructure film, may be $TiO_2$, $SiO_2$, or polyimide. The high-index undercoat effectively reduces the diffuse reflection in the conductive region, but has no impact on the non-conductive region, thus reducing or eliminating the light scattering differentials between the two regions. The end result is that the pattern becomes less visible. All the other approaches described herein to reducing diffuse reflection can also be employed in reducing pattern visibility.

The various components of the conductive film are described in more detail below.

Conductive Nanostructures

Generally speaking, the transparent conductors described herein are thin conductive films of conductive nanostructures. In the transparent conductor, one or more electrically conductive paths are established through continuous physical contacts among the nanostructures. A conductive network of nanostructures is formed when sufficient nanostructures are present to reach an electrical percolation threshold. The electrical percolation threshold is therefore an important value above which long range connectivity can be achieved.

As used herein, "conductive nanostructures" or "nanostructures" generally refer to electrically conductive nano-sized structures, at least one dimension of which is less than 500 nm, more preferably, less than 250 nm, 100 nm, 50 nm or 25 nm.

The nanostructures can be of any shape or geometry. In certain embodiments, the nanostructures are isotropically shaped (i.e., aspect ratio=1). Typical isotropic nanostructures include nanoparticles. In preferred embodiments, the nanostructures are anisotropically shaped (i.e., aspect ratio≠1). As used herein, "aspect ratio" refers to the ratio between the length and the width (or diameter) of the nanostructure. The anisotropic nanostructure typically has a longitudinal axis along its length. Exemplary anisotropic nanostructures include nanowires and nanotubes, as defined herein.

The nanostructures can be solid or hollow. Solid nanostructures include, for example, nanoparticles and nanowires. "Nanowires" thus refers to solid anisotropic nanostructures. Typically, each nanowire has an aspect ratio (length:diameter) of greater than 10, preferably greater than 50, and more preferably greater than 100. Typically, the nanowires are more than 500 nm, more than 1 μm, or more than 10 μm long.

Hollow nanostructures include, for example, nanotubes. Typically, the nanotube has an aspect ratio (length:diameter) of greater than 10, preferably greater than 50, and more preferably greater than 100. Typically, the nanotubes are more than 500 nm, more than 1 μm, or more than 10 μm in length.

The nanostructures can be formed of any electrically conductive material. Most typically, the conductive material is metallic. The metallic material can be an elemental metal (e.g., transition metals) or a metal compound (e.g., metal oxide). The metallic material can also be a bimetallic material or a metal alloy, which comprises two or more types of metal. Suitable metals include, but are not limited to, silver, gold, copper, nickel, gold-plated silver, platinum and palladium. The conductive material can also be non-metallic, such as carbon or graphite (an allotrope of carbon).

Conductive Film

In general, conductive film is typically in a multi-film configuration, and at least includes a nanostructure layer coated on a substrate. The nanostructure layer is formed by depositing a coating composition (also referred to as "ink composition") comprising a liquid carrier and a plurality of conductive nanostructures (as described in more detail below) on the substrate. In addition to the nanostructure layer, the conductive film may further comprise one or two films that are immediately adjacent to the nanostructure layer, i.e., an overcoat and/or an undercoat.

The nanostructure layer or film comprises nanostructures that are randomly distributed and interconnect with one another. As the number of the nanostructures reaches the percolation threshold, the thin film is electrically conductive. Other non-volatile components of the ink composition, including, for example, one or more binders, surfactants and additional viscosity modifiers, may form part of the conductive film.

The liquid carrier for the dispersion may be water, an alcohol, a ketone or a combination thereof. Exemplary alcohols may include isopropanol (IPA), ethanol, diacetone alcohol (DAA) or a combination of IPA and DAA. Exemplary ketones may include methyl ethyl ketone (MEK) and methyl propyl ketone (MPK).

The surfactants serve to reduce aggregation of the nanostructures. Representative examples of suitable surfactants include fluorosurfactants such as ZONYL® surfactants, including ZONYL® FSN, ZONYL® FSO, ZONYL® FSA, ZONYL® FSH (DuPont Chemicals, Wilmington, Del.), and NOVEC™ (3M, St. Paul, Minn.). Other exemplary surfactants include non-ionic surfactants based on alkylphenol ethoxylates. Preferred surfactants include, for example, octylphenol ethoxylates such as TRITON™ (×100, ×114, ×45), and nonylphenol ethoxylates such as TERGITOL™ (Dow Chemical Company, Midland Mich.). Further exemplary non-ionic surfactants include acetylenic-based surfactants such as DYNOL® (604, 607) (Air Products and Chemicals, Inc., Allentown, Pa.) and n-dodecyl 13-D-maltoside.

The binder acts as a viscosity modifier in the ink composition and may affect the rheology of the same during the coating process. The binder also helps to immobilize the nanostructures on a substrate. Examples of suitable binders include hydroxypropyl methylcellulose (HPMC), methyl cellulose, xanthan gum, polyvinyl alcohol, carboxy methyl cellulose, and hydroxy ethyl cellulose.

In particular embodiments, the weight ratio of the surfactant to the binder in the coating solution is preferably in the range of about 80:1 to about 0.01:1; the weight ratio of the binder to the conductive nanostructures is preferably in the range of about 5:1 to about 0.000625:1; and the weight ratio of the conductive nanostructures to the surfactant is preferably in the range of about 560:1 to about 5:1. The ratios of components of the coating solution may be modified depending on the substrate and the method of application used. A preferred viscosity range for the coating solution is between about 1 and 100 cP.

In one embodiment, the coating solution may initially contain a binder (e.g., HPMC) to facilitate film forming. However, the binder could be removed (by washing or plasma treatment) thereafter such that the nanostructures form a discontinuous layer.

The electrical conductivity of the conductive film is often measured by "sheet resistance," which is represented by Ohms/square (or "ohms/sq"). The sheet resistance is a function of at least the surface loading density, the size/shapes of the nanostructures, and the intrinsic electrical property of the nanostructure constituents. As used herein, a thin film is considered conductive if it has a sheet resistance of no higher than $10^8$ ohms/sq. Preferably, the sheet resistance is no higher than $10^4$ ohms/sq, 3,000 ohms/sq, 1,000 ohms/sq or 350 ohms/sq, or 100 ohms/sq. Typically, the sheet resistance of a conductive network formed by metal nanostructures is in the ranges of from 10 ohms/sq to 1000 ohms/sq, from 100 ohms/sq to 750 ohms/sq, 50 ohms/sq to 200 ohms/sq, from 100 ohms/sq to 500 ohms/sq, or from 100 ohms/sq to 250 ohms/sq, or 10 ohms/sq to 200 ohms/sq, from 10 ohms/sq to 50 ohms/sq, or from 1 ohms/sq to 10 ohms/sq. For the opto-electrical devices described herein, the sheet resistance is typically less than 1000 ohms/sq, or less than 500 ohms/sq, or less than 100 ohms/sq, or less than 50 ohms/square, or less than 20 ohms/square, or less than 10 ohms/square.

Optically, the nanostructure-based transparent conductors have high light transmission in the visible region (400 nm-700 nm). Typically, the transparent conductor is considered optically clear when the light transmission is more than 70%, or more typically more than 85% in the visible region. More preferably, the light transmission is more than 90%, more than 93%, or more than 95%. As used herein, unless specified otherwise, a conductive film is optically transparent (e.g., more than 70% in transmission). Thus, transparent conductor, transparent conductive film, layer or coating, conductive film, layer or coating, and transparent electrode are used interchangeably.

Haze is an index of optical clarity. Haze results from forward light-scattering and reflection/refraction due to both bulk and surface roughness effects. Typically, the transparent conductive film describe herein has a haze value of less than 3%, or less than 2%, or less than 1%. Unless otherwise specified, the haze value of a give transparent conductor described and claimed herein is measured photo-optically in accordance with ASTM D 1003-07, "Standard Test Method for Haze and Luminous Transmittance of Transparent Plastics."

Substrate

The substrate supports the nanostructure film. In certain embodiments, the substrate is the support on which the ink composition is directly coated to form the nanostructure film, as defined herein. In other embodiments, an intermediate layer (i.e., an undercoat) is coated on the substrate before the ink composition is coated.

The substrate can be rigid or flexible. Examples of rigid substrates include glass, polycarbonates, acrylics, and the like. Examples of flexible substrates include, but are not limited to: polyesters (e.g., polyethylene terephthalate (PET), polyester naphthalate, and polycarbonate), polyolefins (e.g., linear, branched, and cyclic polyolefins), polyvinyls (e.g., polyvinyl chloride, polyvinylidene chloride, polyvinyl acetals, polystyrene, polyacrylates, and the like), cellulose ester bases (e.g., cellulose triacetate, and cellulose acetate), polysulphones such as polyethersulphone, polyimides, silicones, and other conventional polymeric films.

EXAMPLES

Example 1

Synthesis of Silver Nanowires

Silver nanowires were synthesized by the reduction of silver nitrate dissolved in ethylene glycol in the presence of poly(vinyl pyrrolidone) (PVP) following the "polyol" method described in, e.g., Y. Sun, B. Gates, B. Mayers, & Y. Xia, "Crystalline silver nanowires by soft solution processing," *Nanoletters* 2(2): 165-168, 2002. A modified polyol method, described in co-pending and co-owned U.S. patent application Ser. No. 11/766,552, produces more uniform silver nanowires at higher yields than does the conventional "polyol" method. This application is incorporated by reference herein in its entirety. Resulting nanowires primarily had lengths from about 13 µm to about 17 µm and diameters from about 25-45 nm.

Example 2

Standard Preparation of Coating Composition of Conductive Nanostructures

A typical coating composition for depositing metal nanowires comprises, by weight, from 0.0025% to 0.1% surfactant (e.g., a preferred range is from 0.0025% to 0.05% for ZONYL® FSO-100), from 0.02% to 4% viscosity modifier (e.g., a preferred range is 0.02% to 0.5% for hydroxypropyl methylcellulose (HPMC), from 94.5% to 99.0% solvent and from 0.05% to 1.4% metal nanowires.

The coating composition can be prepared based on a desired concentration of the nanowires, which is an index of the loading density of the final conductive film formed on the substrate.

The coating composition can be deposited on a substrate according to, for example, the methods described in co-pending U.S. patent application Ser. No. 11/504,822.

As understood by one skilled in the art, other deposition techniques can be employed, e.g., sedimentation flow metered by a narrow channel, die flow, flow on an incline, slit coating, gravure coating, microgravure coating, bead coating, dip coating, slot die coating, and the like. Printing techniques can also be used to directly print an ink composition onto a substrate with or without a pattern. For example, inkjet, flexoprinting and screen printing can be employed. It is further understood that the viscosity and shear behavior of the fluid as well as the interactions between the nanowires may affect the distribution and interconnectivity of the nanowires deposited.

A sample conductive nanostructure dispersion was prepared that comprised silver nanowires as fabricated in Example 1, a surfactant (e.g., Triton), and a viscosity modifier (e.g., low molecular-weight HPMC) and water. The final dispersion included about 0.4% silver and 0.4% HPMC (by weight), i.e., the weight ratio is 1:1.

Example 3

Measurement of Diffuse Reflection

Figure 15:
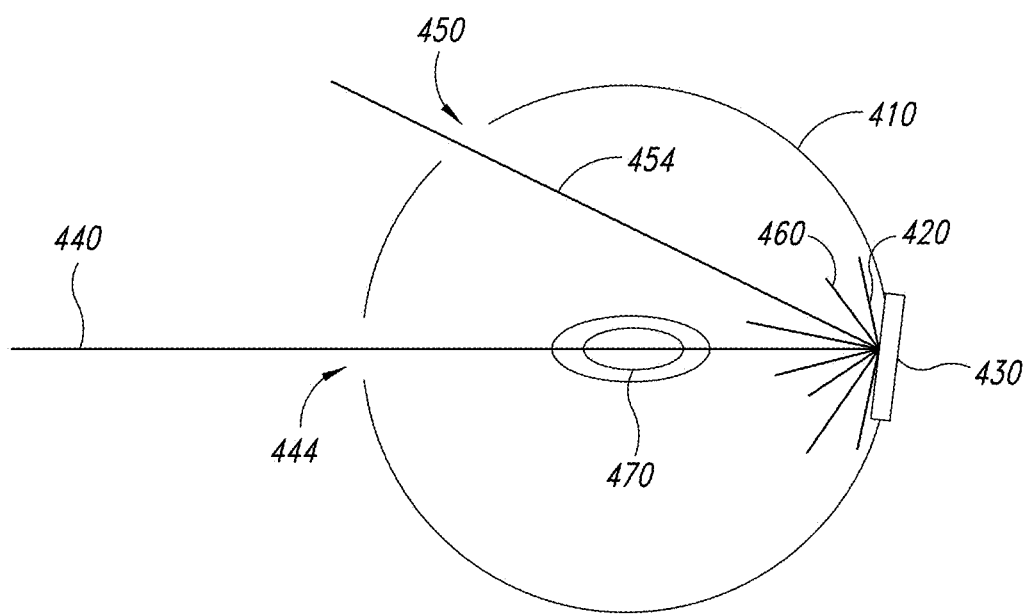
FIG. 15 schematically shows a method for measuring diffuse reflection.

As schematically shown in FIG. 15, diffuse reflection can be measured using the Perkin Elmer Lambda 650 UV/Vis spectrophotometer attached with a 150 mm integrating sphere (410). Samples are mounted in the rear sample mount (420) on a reflectance port (430). The incident light (440) enters into the sphere through a transmission port (444), and is reflected back off the sample at 8 degree and collected by the sphere (410). When the specular light port (450) is closed, total reflectance including both specular (454) and diffuse reflection (460) is measured at a detector (470). Diffuse reflection is measured when the specular light port (450) is open, which allows the specular component to exit the sphere through the open specular port.

Example 4

Plasma Treatment

Figure 16:
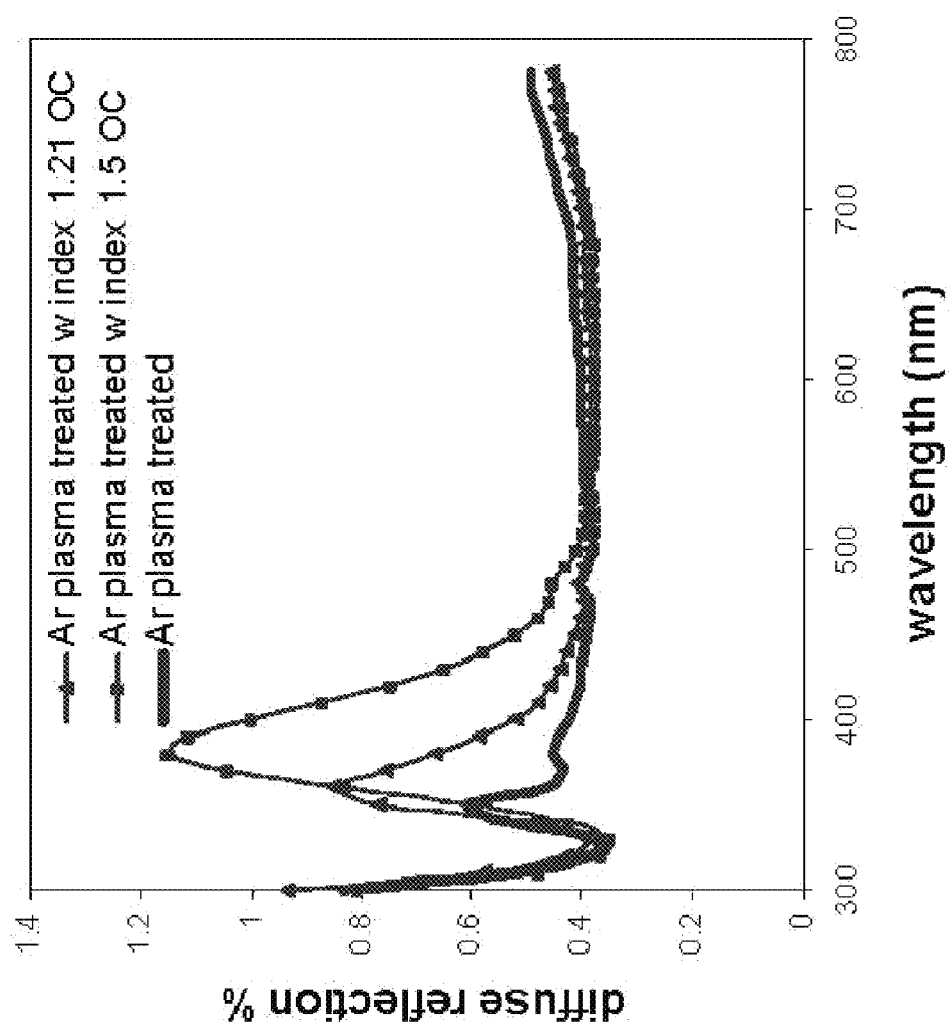
FIG. 16 shows the comparative results of diffuse reflections in conductive films with a binder, as compared to a conductive film in which the binder has been removed by washing and a conductive film that has been plasma treated.

An ink composition was prepared that comprised 0.1% silver nanowires, 0.2% HPMC, and 250 ppm TRITON™ x-100. The ink was spin-coated on glass substrates (1200 rpm/30 s). A transparent conductive film of 250-270 ohms/sq was obtained. Three samples were prepared. All were subjected to Ar plasma treatment (300 Watts for 90 s). Two of the samples were coated with overcoats having $R_D=1.5$ and $R_D=1.21$, respectively. The diffuse reflections of the samples are shown in FIG. 16. As shown, the sample that has bare wires (i.e., Ar plasma treatment removed the binder and any coating on the wires) has the lowest diffuse reflection, especially at 380 nm. The sample with low-index overcoat ($R_D=1.21$) had a lower diffuse reflection than the sample with higher index overcoat ($R_D=1.5$).

Example 5

Low-Visibility Pattern

Sample 1: Several silver nanowire-based conductive films were prepared on glass substrates with different line gaps (see, e.g., FIG. 14A). The sheet resistance in the conductive regions was 120 ohms/sq. The non-conductive regions were fully etched, leaving no or little nanostructure residue on the substrate.

Sample 2: As a comparison, several conductive films were prepared with a high-index undercoat ($TiO_2$) interposed between the nanostructure layer and the substrate. All other parameters were the same as Sample 1.

The films were inspected visually from the side of the nanowire layer. Table 3 shows the visual inspection results.

TABLE 3

|  | 25 µm line gap | 100 µm line gap | 200/400 µm line gap |
|---|---|---|---|
| Sample 1 | visible under strong light | visible under room light | visible under room light |
| Sample 2 | Invisible under strong light | Invisible under room light and hard to see under strong light | hard to see under room light |

Example 6

Low Index Overcoat

Low index overcoat comprises porous silica nanoparticles were prepared by spin coating.

Silica nanoparticles were supplied by Tokyo Ohka Kogyo Co. ltd (LAL 2020) as dispersion. The dispersion contains silica nanoparticles (<5 wt %), an acrylic resin (<1 wt %) in a solvent. The total solids are about 2.35 wt %. The dispersion, without any additional binder yields highly transparent, low refractive index film (RI=1.22) after coating.

The additional binder is a UV-curable hard coat resin, supplied by Addison Clear Wave Coatings Inc (HC 5619). The UV curable binder was dissolved in solvents such as propylene glycol monomethyl ether or 50/50 mixture of isopropanol and diacetone alcohol at high concentration (40 wt % solids) to provide a binder solution.

The binder solution was then slowly added to the LAL 2020 solution at different levels to achieve different formulations with varied ratios of nanoparticles to the binder. Formulations A-E were prepared and their compositions are shown in Table 4.

The formulations (A-E) were then coated on different substrates such as bare glass or PET film pre-coated with silver nanowires (e.g., ClearOhm® by Cambrios Technologies Corporation) by spin or slot die coating techniques. The coated films were then exposed to a source of UV radiation to cure.

The spin coating and curing conditions are as follows:
Substrate: 2"×2" Glass
Spin speed: 500, 1000, 1500 rpm,
Ramp: 500 rpm/s
Time: 30 s
Drying: 50° C./120° C. for 2 min each
Curing: Air, UV A+UV B=3 j/cm$^2$ As shown in Table 4, after coating the overcoat, the final transmission of the film was significantly improved and final % haze of the silver nanowires-on-PET substrate was significantly decreased. The diffuse reflections of the films are shown in FIGS. 17A-17E.

TABLE 4

Figure 17A:
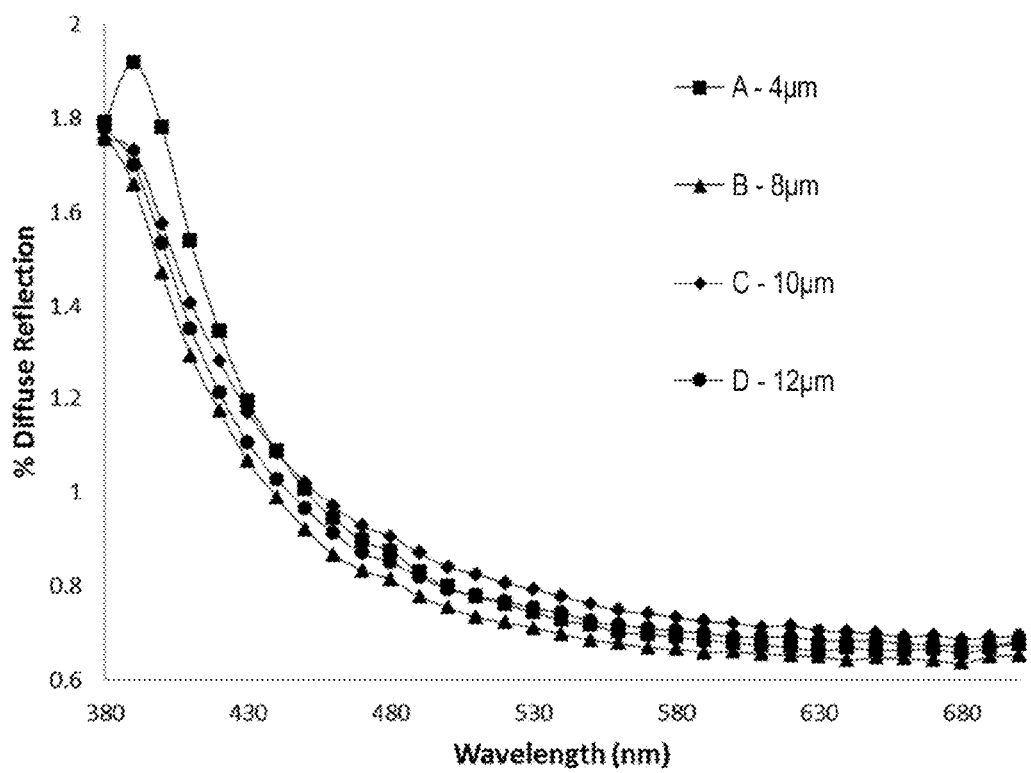
FIGS. 17A-17E show the diffuse reflections of various optical stacks having a low-index overcoat.
Figure 17B:
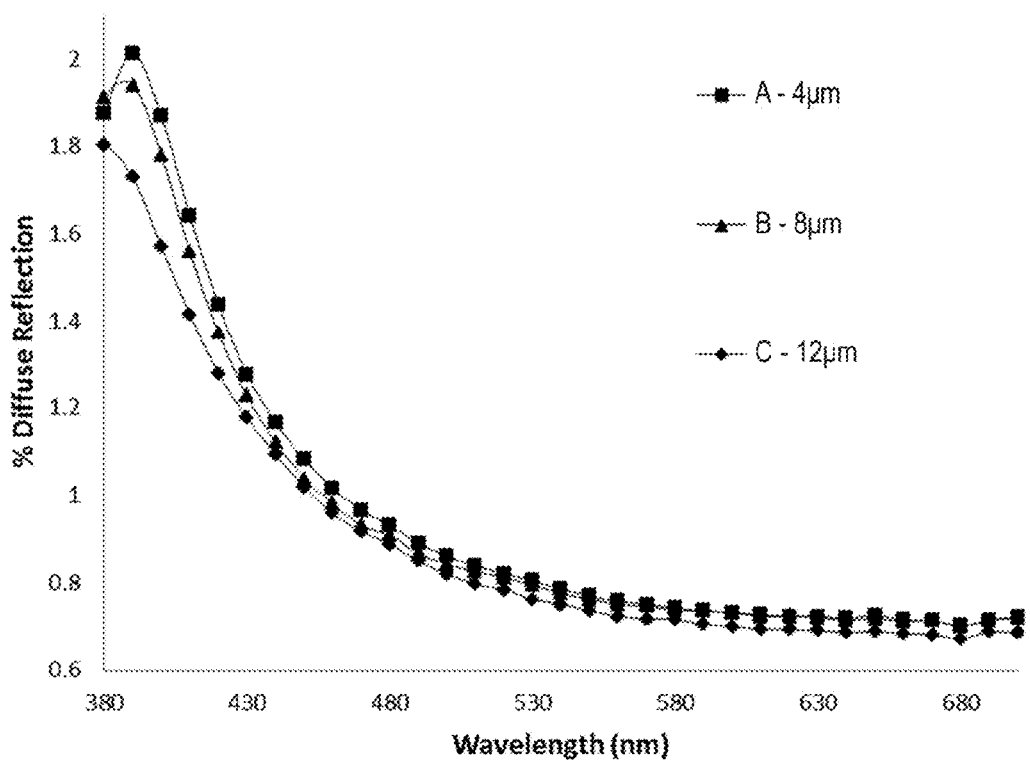
Figure 17C:
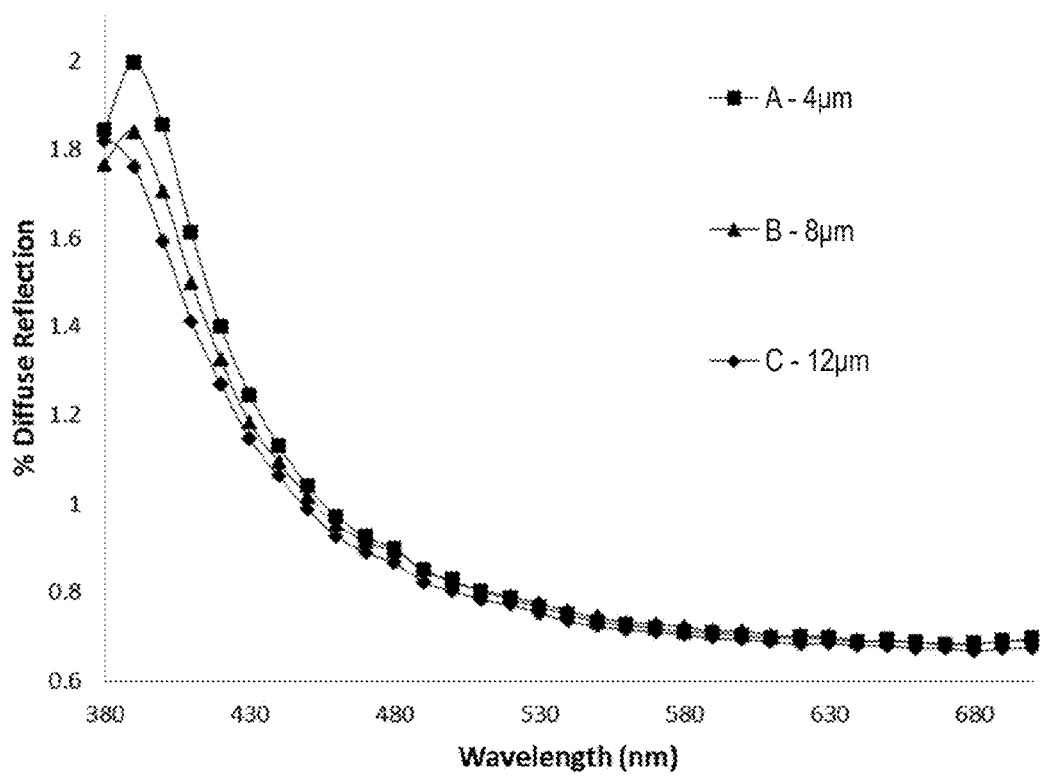
Figure 17D:
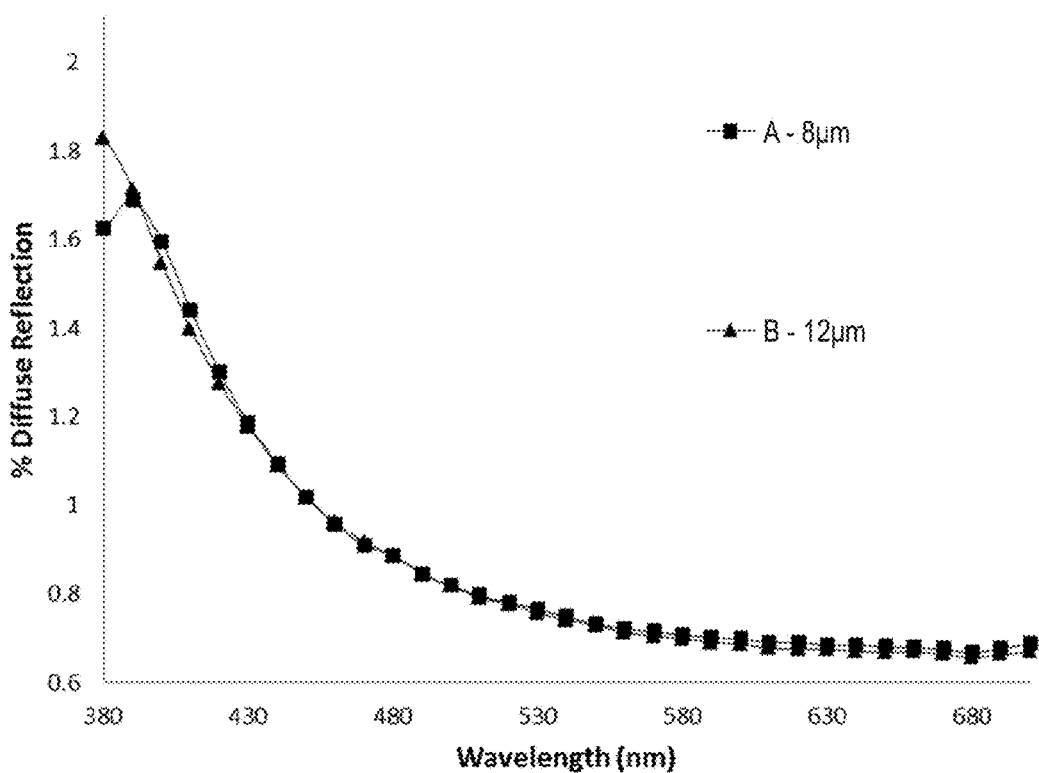
Figure 17E:
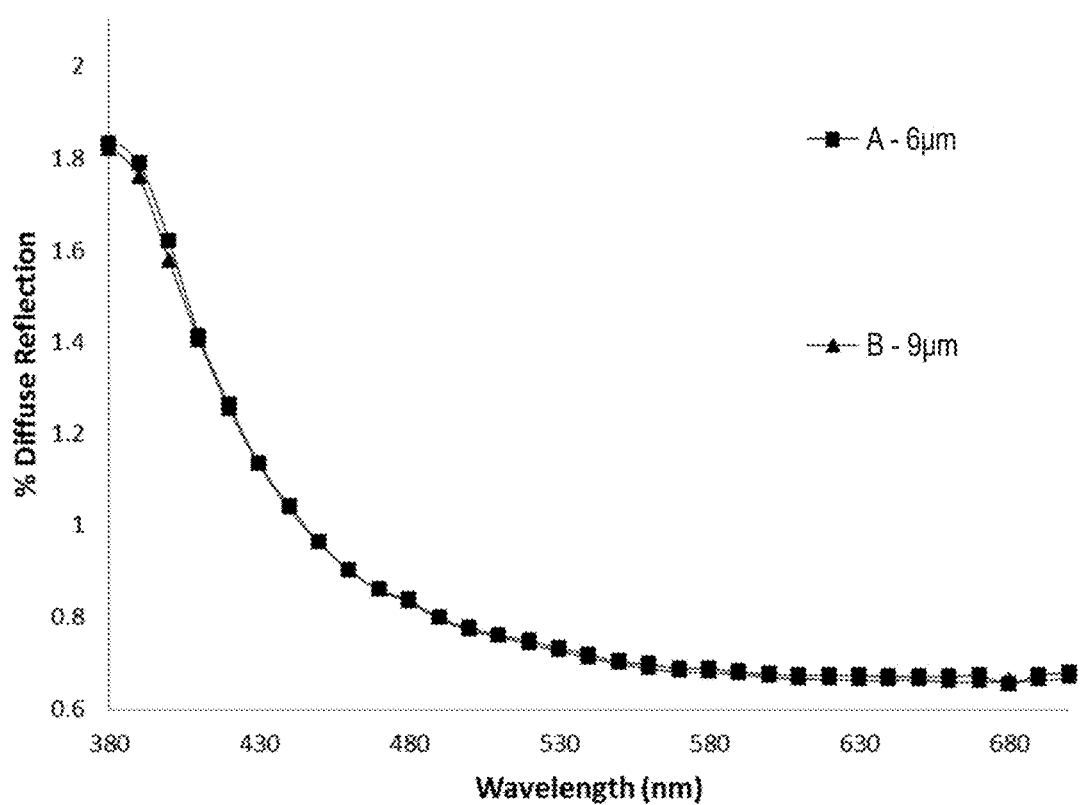

| Coating fluid (wt % solids) | Non volatile composition | | Coating WFT (μm) | Average % Transmission | Average % Haze | Diffuse Reflection % |
| | HC 5619 wt % | LAL 2020 wt % | | | | |
| --- | --- | --- | --- | --- | --- | --- |
| A  2.35 | 0 | 100 | 4 | 94.58 | 0.81 | FIG. 17A |
| | | | 8 | 93.23 | 0.68 | |
| | | | 10 | 95.01 | 0.83 | |
| | | | 12 | 94.11 | 0.72 | |
| B  2.73 | 14.5 | 85.5 | 4 | 93.92 | 0.87 | FIG. 17B |
| | | | 8 | 93.93 | 0.74 | |
| | | | 12 | 92.41 | 0.76 | |
| C  2.82 | 17.8 | 82.2 | 4 | 93.25 | 1.01 | FIG. 17C |
| | | | 8 | 95.07 | 0.76 | |
| | | | 12 | 93.75 | 0.74 | |
| D  3.09 | 25.4 | 74.6 | 8 | 93.60 | 0.90 | FIG. 17D |
| | | | 12 | 92.56 | 0.90 | |
| E  3.45 | 33.8 | 66.2 | 6 | 93.76 | 0.94 | FIG. 17E |
| | | | 9 | 93.09 | 0.89 | |

The mechanical properties of the films were assessed by a rub test. Specifically, a clean-room wipe moistened with isopropanol (IPA) was used to rub the surface of the overcoat. It was found Formulations D and E provided overcoats that were particularly robust and could withstand the rub test (i.e., no surface damage after rubbing with IPA).

The various embodiments described above can be combined to provide further embodiments. All of the U.S. patents, U.S. patent application publications, U.S. patent application, foreign patents, foreign patent application and non-patent publications referred to in this specification and/ or listed in the Application Data Sheet are incorporated herein by reference, in their entirety. Aspects of the embodiments can be modified, if necessary to employ concepts of the various patents, application and publications to provide yet further embodiments.

These and other changes can be made to the embodiments in light of the above-detailed description. In general, in the following claims, the terms used should not be construed to limit the claims to the specific embodiments disclosed in the specification and the claims, but should be construed to include all possible embodiments along with the full scope of equivalents to which such claims are entitled. Accordingly, the claims are not limited by the disclosure.

The invention claimed is:

1. An optical stack comprising:
   at least one nanostructure layer;
   an overcoat immediately overlying the nanostructure layer, wherein the overcoat comprises a plurality of porous nanoparticles;
   at least one substrate adjacent to the nanostructure layer; and
   an outermost cover layer that is most proximate to an incident light, wherein:
   the outermost cover layer is made of polyimides or clear polymers embedded with high refractive index particles selected from ZnO, ZrO$_2$, or TiO$_2$, and has a refractive index of at least 1.7,
   the nanostructure layer comprises a plurality of conductive nanostructures embedded in an insulating medium,
   a diffuse reflection of the incident light, as viewed from a same side of the optical stack as the incident light, is less than 6% of the incident light, and
   the nanostructure layer is more proximate to the incident light than the substrate.

2. The optical stack of claim 1, wherein the insulating medium has a refractive index of less than 1.5.

3. The optical stack of claim 2, wherein the insulating medium is air.

4. The optical stack of claim 1, wherein the plurality of conductive nanostructures do not individually have an organic coating or have a low-index organic coating.

5. The optical stack of claim 1 wherein:
   the insulating medium is HPMC,
   the plurality of conductive nanostructures are silver nanowires,
   a weight ratio of the HPMC and the plurality of conductive nanostructures is about 1:1, and the nanostructure layer has a sheet resistance of less than 100 ohms/sq.

6. The optical stack of claim 1, wherein the overcoat has a refractive index of less than 1.55.

7. The optical stack of claim 6, wherein the overcoat is a low-index optically clear adhesive (OCA) layer having a refractive index of 1.45 or less.

8. The optical stack of claim 6, wherein the overcoat further comprises a low-index binder.

9. The optical stack of claim 8, wherein the plurality of porous nanoparticles are silica nanoparticles having an internal void volume of 50-90%.

10. The optical stack of claim 9, wherein the plurality of porous nanoparticles are present at 20-80% by volume of the overcoat.

11. The optical stack of claim 8, wherein the low-index binder is a UV-curable resin having a refractive index of less than 1.5.

12. The optical stack of claim 11, wherein the low-index binder is an acrylic or polyurethane resin.

13. The optical stack of claim 8, wherein the overcoat has a refractive index of 1.22.

14. The optical stack of claim 1, further comprising an undercoat interposed between the substrate and the nanostructure layer, wherein:

the undercoat immediate underlies the nanostructure layer, and the undercoat has a higher refractive index than that of the insulating medium and that of the substrate.

15. The optical stack of claim 14, wherein the undercoat is made of $TiO_2$, $SiO_2$, or polyimide independently, and has a refractive index of at least 1.65.

16. The optical stack of claim 1, wherein the outermost cover layer is a $TiO_2$ layer.

17. The optical stack of claim 1, wherein:

the plurality of conductive nanostructures has a first sheet resistance, the insulating medium has a second sheet resistance, and the first sheet resistance is at least $10^3$ more than the second sheet resistance.

18. The optical stack of claim 1, further comprising an undercoat interposed between the substrate and the nanostructure layer, wherein a refractive index of the nanostructure layer is less than a refractive index of the undercoat.

19. The optical stack of claim 18, wherein the refractive index of the undercoat is greater than a refractive index of the substrate.

20. The optical stack of claim 18, wherein a refractive index of the overcoat is less than or equal to the refractive index of the nanostructure layer.

* * * * *